(12) United States Patent
Herner

(10) Patent No.: US 11,018,122 B1
(45) Date of Patent: May 25, 2021

(54) AREA-EFFICIENT SUBPIXEL APPARATUS

(71) Applicant: Scott Brad Herner, Portland, OR (US)

(72) Inventor: Scott Brad Herner, Portland, OR (US)

(73) Assignee: Black Peak LLC, Boulder, CO (US)

( * ) Notice: Subject to any disclaimer, the term of this patent is extended or adjusted under 35 U.S.C. 154(b) by 90 days.

(21) Appl. No.: 16/671,075

(22) Filed: Oct. 31, 2019

(51) Int. Cl.
*H01L 25/16* (2006.01)
*H01L 27/12* (2006.01)

(52) U.S. Cl.
CPC ........ *H01L 25/167* (2013.01); *H01L 27/1225* (2013.01); *H01L 27/1255* (2013.01)

(58) Field of Classification Search
None
See application file for complete search history.

(56) References Cited

U.S. PATENT DOCUMENTS

| | | | |
|---|---|---|---|
| 7,675,233 B2* | 3/2010 | Lee | H01L 27/3276 313/509 |
| 8,115,788 B2* | 2/2012 | Kimura | H01L 27/1225 345/694 |
| 9,607,548 B2* | 3/2017 | Kimura | G09G 3/3208 |

OTHER PUBLICATIONS

M.A. Haase, J. Xie, T.A. Ballen, J. Zhang, B. Hao, Z.H. Yang, T.J. Miller, X. Sun, T.L. Smith, and C.A. Leatherdale, "II-VI semiconductor color converters for efficient green, yellow, and red light emitting diodes," Applied Physics Letters 96, 231116 (2010).
George Powch and Aja Jain, "Color in next generation micro LED microdisplays," LEDinside, Jun. 7, 2017.

* cited by examiner

*Primary Examiner* — Bo B Jang
(74) *Attorney, Agent, or Firm* — Scott Brad Herner

(57) ABSTRACT

This application describes a subpixel apparatus comprising two transistors, a capacitor, and a small LED. The transistors and capacitor are fabricated in such a manner as to occupy a reduced area and have the small LED overlie them. Methods to form the subpixel apparatus are discussed.

24 Claims, 16 Drawing Sheets

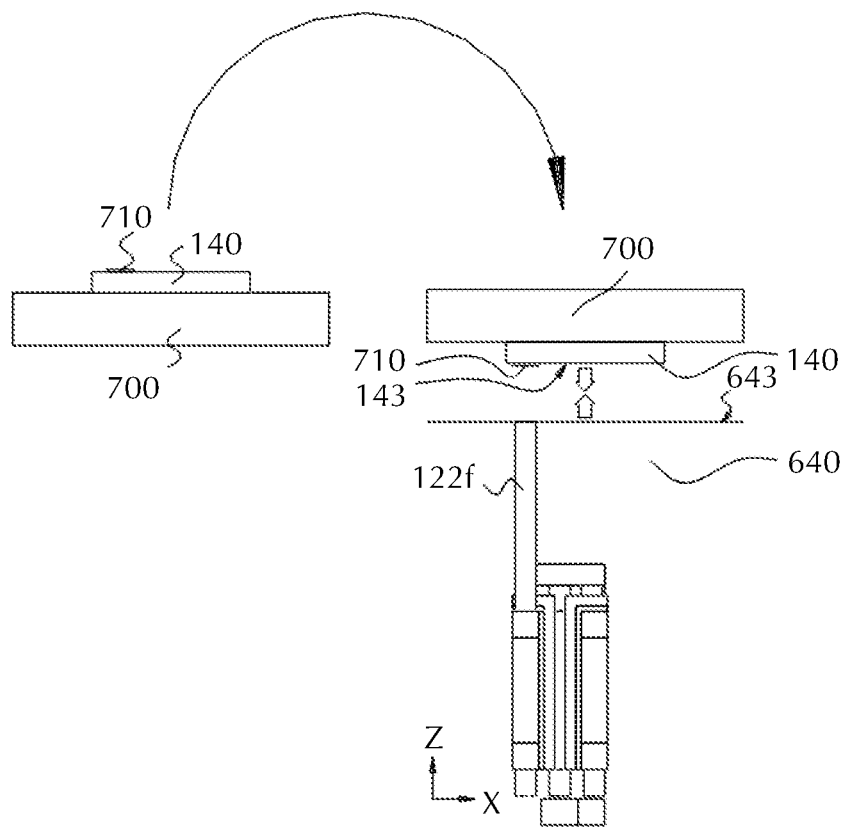
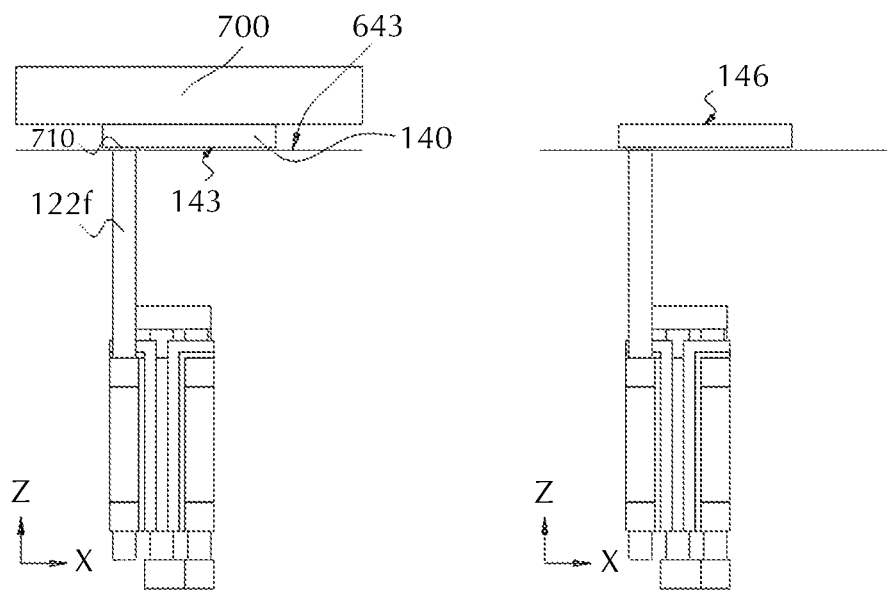
Figure 13I Figure 13J
Figure 13K Figure 13L

AREA-EFFICIENT SUBPIXEL APPARATUS

FIELD

The embodiments of the invention are directed generally to subpixel apparatus, for example for use in a display, having a small area. The subpixel apparatus comprises two transistors, a capacitor, and a light emitting diode (LED). The subpixel apparatus may be a component of a pixel and/or of a display, or as a single point light source.

BACKGROUND

A subpixel apparatus is a light emitting apparatus. A pixel may comprise, for example, three subpixels, each subpixel emitting light of a different dominant wavelength. The dominant light wavelength of the subpixel corresponds to a color. For example, a pixel may comprise three subpixels emitting red, green, and blue light, respectively. In this case, the pixel can emit light of any color by turning on or off its various subpixels. The term "subpixel" and "subpixel apparatus" are used interchangeably in this application. In general, the term "subpixel apparatus" is used when the individual components are being described, while the term "subpixel" is used when describing an element of a pixel or a display. "Pixel" and "pixel apparatus" are similarly used interchangeably with the same conventions as for subpixel and subpixel apparatus. Pixels capable of multicolor light emission may form a color display. A two dimensional array of pixels is a common arrangement for a display. Monochrome displays comprise pixels that emit only one wavelength of light. In the case of monochrome displays, a pixel may comprise only one light emitting apparatus. In this application, the term "subpixel apparatus" will be used throughout to mean an apparatus that emits one dominant wavelength of light. The subpixel apparatus may be used as part of a color display or a monochrome display, or any other suitable application, for example, single point light sources.

A subpixel apparatus may comprise a light source, such as an LED, and control devices to switch the LED on and off, such as thin film transistors and a capacitor. The arrangement of control devices may be known as a control circuit. In a common arrangement for active matrix displays, the control circuit of a subpixel apparatus comprises two transistors and a capacitor, known as a "2T1C" circuit. The drive transistor controls the brightness of the subpixel apparatus. The address transistor receives a scanning signal to its gate, and the drain of the address transistor is connected to a data line to receive an image data signal. A source terminal is connected to the gate of the drive transistor to control the on/off states of the drive transistor. The source or drain of the drive transistor is connected to an electrode of the LED. The capacitor is connected to the gate of the drive transistor and assists the drive transistor to stay in an on or off state.

When each subpixel apparatus in a display is selectively addressed by its individual thin film transistor(s) to change the state of the subpixel, the arrangement is known as an active matrix display. The resolution of a display may be improved by using subpixels with smaller area and/or packing them more closely together. This technique can also be used to shrink the size of a display. One method to decrease the area of the subpixel is to decrease the area of the LED. Small displays, such as those for watches or augmented reality headsets, require small subpixels. In conventional subpixel apparatus, the control devices are placed alongside the LED, with the area of the subpixel being the areas of the control devices and the LED, and other associated elements such as interconnects and unoccupied space such as needed for insulating one subpixel from a neighboring subpixel and for manufacturing tolerance. However, arranging all the elements of a subpixel apparatus in a two dimensional layout is an inefficient use of area.

SUMMARY

A subpixel apparatus in an embodiment according to the present invention includes: a first transistor with a first transistor lower source drain, a first transistor upper source drain, a first transistor channel, a first transistor gate dielectric, and a first transistor gate conductor; a second transistor with a second transistor lower source drain, a second transistor upper source drain, a second transistor channel, a second transistor gate dielectric, and a second transistor gate conductor; a capacitive that is in operative communication with the first transistor and second transistor; and a light emitting diode overlying the first transistor, the second transistor, and the capacitor, and wherein the light emitting diode is in operative communication with the second transistor.

A subpixel apparatus in an embodiment according to the present invention includes: a first transistor with a first transistor source, a first transistor drain, a first transistor channel, a first transistor gate dielectric, and a first transistor gate conductor; a second transistor with a second transistor source, a second transistor drain, a second transistor channel, a second transistor gate dielectric, and a second transistor gate conductor; a capacitor with a longest dimension, wherein the capacitor is in operative communication with the first and second transistor; a substantially planar light emitting diode, wherein the substantially planar light emitting diode is in operative communication with the second transistor; and wherein the longest dimension of the capacitor is substantially orthogonal to the substantially planar light emitting diode.

BRIEF DESCRIPTION OF THE DRAWINGS

The drawings are idealized representations to describe embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout. The features, aspects, and advantages of the embodiments described herein will become better understood with regard to the following description, appended claims, and accompanying drawings, where:

FIGS. 13A-13L are a sequence of schematic illustrations describing the fabrication of one embodiment of the invention.

DETAILED DESCRIPTION OF EMBODIMENTS

Figure 1:
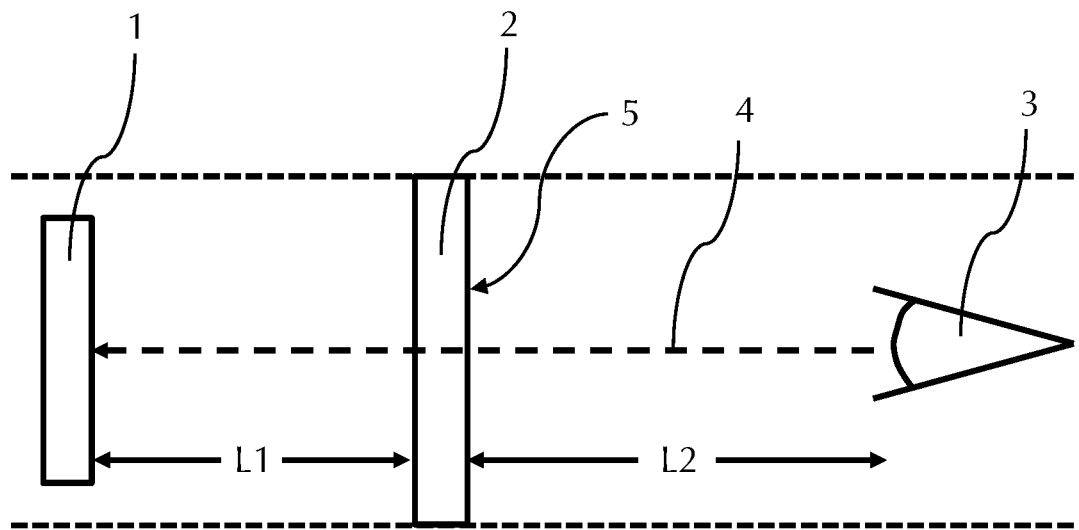
FIG. 1 schematically illustrates an example of a cross sectional view of one element overlying a second element as seen by a viewer.

It is desirable to reduce the area of the LED in a subpixel apparatus to enable higher resolution and/or smaller displays. For the embodiments in this application, the LEDs will be inorganic semiconductors, and not organic semiconductors. Small area LEDs have sometimes been called micro-LEDs, and may have lateral dimensions of 50 microns×50 microns, 50 microns×20 microns, 20 microns×20 microns, 10 microns×10 microns, or even smaller. The largest area of square-shaped LED with dimensions 20 microns×20 microns is 400 microns squared. The largest area of square-shaped LED with dimensions 10 microns×10 microns is 100 microns squared. Fabrication of displays using micro-LEDs requires different fabrication techniques compared to larger area LEDs. For example, multiple larger area LEDs may be fabricated on a substrate of over 1000 millimeters squared in area and then separated into single LED dies measuring 200 microns×200 microns, and may include a portion of the LED substrate. These large area LED dies may then be mechanically placed into a package with other LED dies, and wire bonded to connect the LEDs to other devices, for example, control devices like thin film transistors that are alongside the LED. As the LED area shrinks to 50 microns×50 microns or less, mechanical placement and wire bonding of individual LEDs is no longer feasible. New techniques must be employed to assemble micro-LEDs into displays. To decrease the area of the subpixel, it is advantageous to fit the control devices underneath the LED in a stacked, three dimensional arrangement. In embodiments described herein, the control devices fit underneath the LED in the completed subpixel apparatus. When viewed top-down, the LED will obscure the control devices. To enable the LED to have a small area and yet still fit the control devices underneath, the control devices are fabricated in a manner to occupy a small area.

Control devices such as conventional horizontal thin film transistors and horizontal capacitors may no longer fit completely underneath a small LED. The present invention describes a subpixel apparatus with control devices to fit underneath an LED with a small area. The area of the LED, or footprint, refers to the largest area of the LED. LEDs are usually substantially planar devices, having a first polygon surface opposite a second polygon surface. Both polygon surfaces are substantially planar. The first and second polygon surfaces are substantially parallel to one another and separated by a thickness. For example, a substantially planar micro-LED may have first and second polygon surfaces that are both square-shaped with dimensions of 20 microns×20 microns and a thickness of 2 microns. The largest area of the LED in this example would be 400 microns squared. The terms "small LED, small subpixel, or small subpixel apparatus" are all meant to describe the footprint that the LED, subpixel, or subpixel apparatus occupy. In conventional displays, the substantially planar LEDs in a subpixel apparatus may have dimensions of, for example, 200 microns×200 microns, resulting in an area of 40,000 microns squared, or larger.

Figure 2:
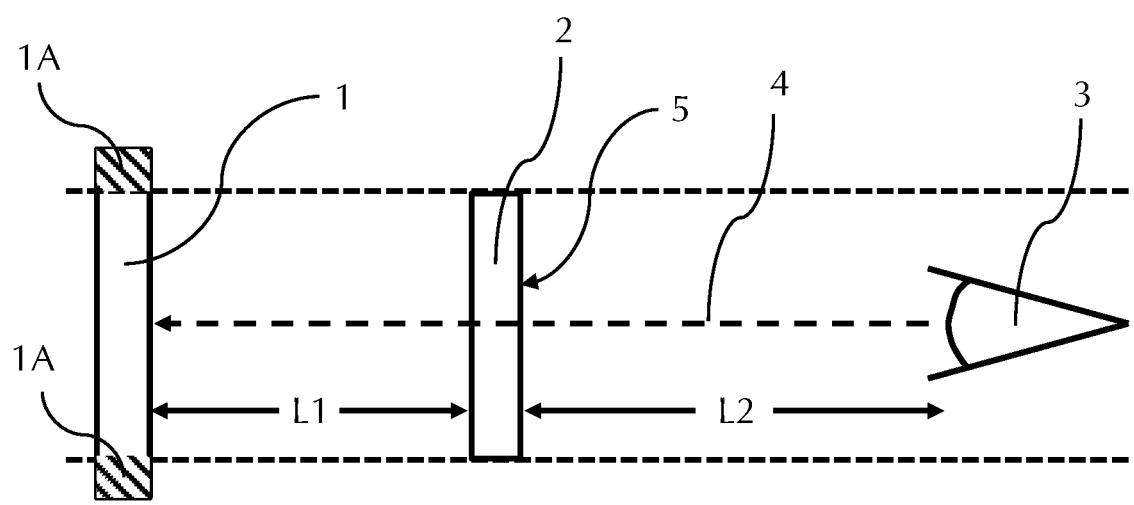
FIG. 2 schematically illustrates an example of a cross sectional view of one element overlying a second element as seen by a viewer.
Figure 3:
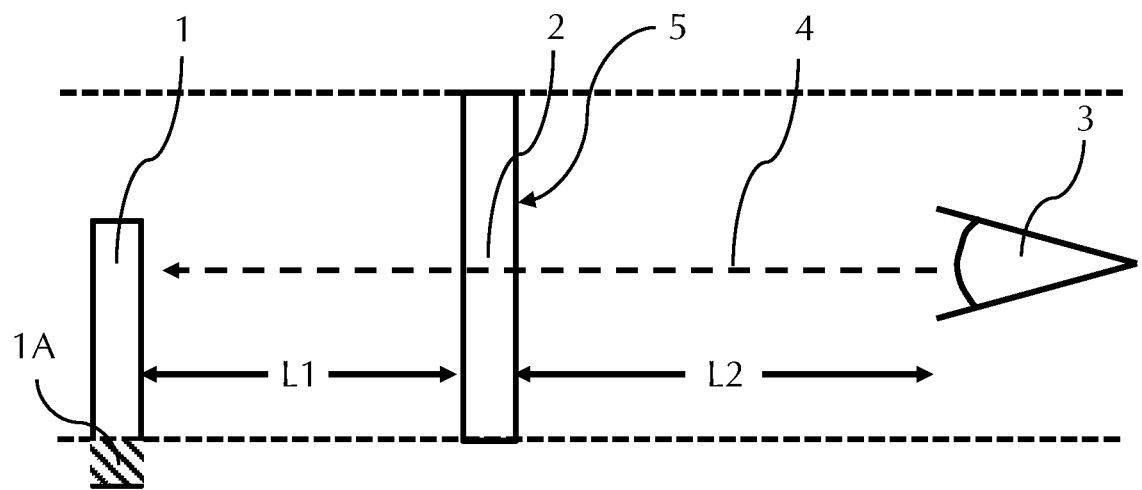
FIG. 3 schematically illustrates an example of a cross sectional view of one element overlying a second element as seen by a viewer.
Figure 4:
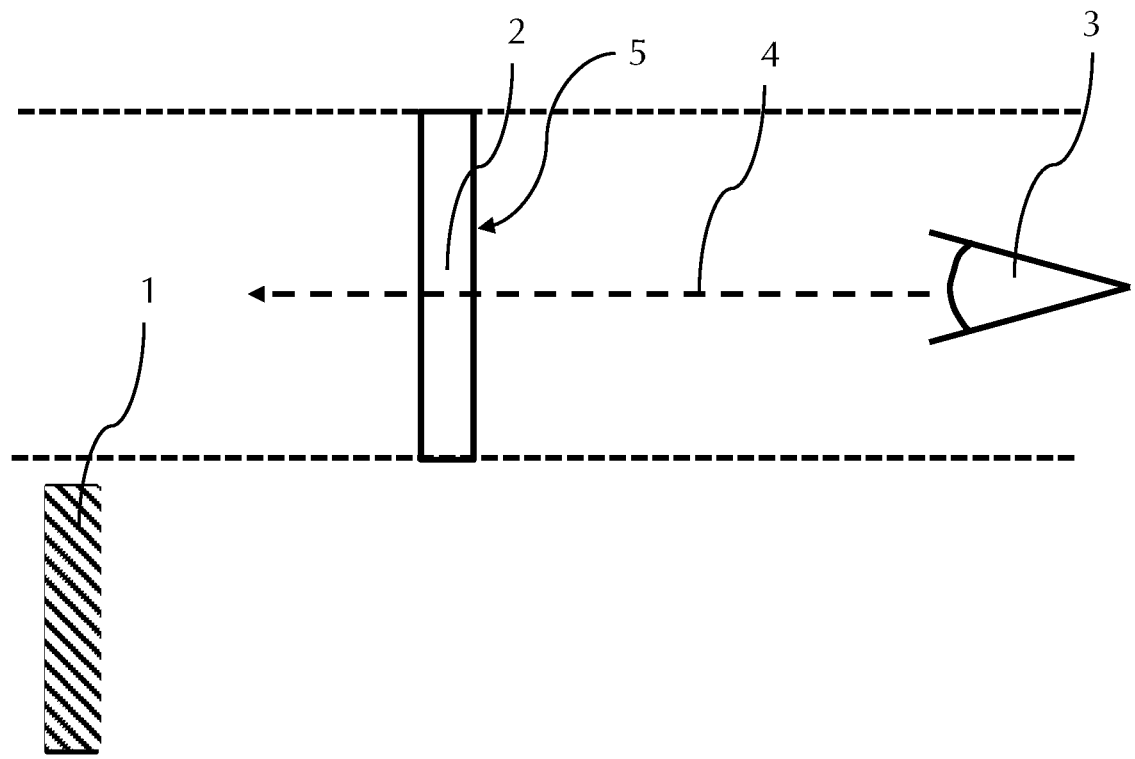
FIG. 4 schematically illustrates an example of a cross sectional view of two elements as seen by a viewer.

As used herein, the term "overlying" describes a second element that at least partially obscures a first element or elements when the second element is between the first element or elements and a viewer. The term "underlying" describes a first element or elements that is or are at least partially obscured by a second element when the second element is between a viewer and the first element or elements. The viewer is on a line orthogonal to the center of the surface of the second element facing the viewer of the second element. As shown by example in FIG. 1, a second element 2 overlies a first element 1 because second element 2 lies between first element 1 and a viewer 3, and second element 2 obscures first element 1 from viewer 3. In FIGS. 1-3, the dimension L2 is the distance between viewer 3 and second element 2, and the dimension L1 is the distance between element 1 and element 2. The ratio of L2 to L1 is at least 100×. In one example, dimension L2 is 2 meters and dimension L1 is 2 microns, and the ratio L2/L1 is 1,000,000×. In FIGS. 1-4, the surface 5 is the surface of the second element facing viewer 3, and line 4 is orthogonal to the surface 5 and transits the center of surface 5. First element 1 underlies second element 2 in FIG. 1. First element 1 is completely obscured from viewer 3 by second element 2 in FIG. 1. In another example shown in FIG. 2, a second element 2 overlies a first element 1 because second element 2 lies between first element 1 and viewer 3, and second element 2 obscures first element 1 from viewer 3. First element 1 underlies second element 2. In this example, the first element 1 is partially obscured by second element 2 from viewer 3, with portion 1A of first element 1 that does not underlie second element 2. In another example shown in FIG. 3, a second element 2 overlies a first element 1 because second element 2 lies between first element 1 and a viewer 3 and second element 2 obscures first element 1 from viewer 3. First element 1 underlies second element 2. In this example, the first element 1 is partially obscured by second element 2 from viewer 3, with portion 1A of first element 1 that does not underlie second element 2. In another example shown in FIG. 4, a second element 2 does not overlie a first element 1 because second element 2 does not obscure first element 1 from a viewer 3.

When an element is referred to being "directly on" on another element, there are no intervening elements present. As used herein, the phrase "operative communication" describes a functional connection. As used herein, the phrase "largest area" refers to the largest area polygon of multiple polygons that enclose a solid element. As used herein, the phrase "longest dimension" refers to the largest dimension of an object, wherein the object has a size defined by its three dimensions in the X-Y-Z Cartesian coordinate system. The largest dimension will be parallel to one of the X, Y, or Z axes.

Figure 5:
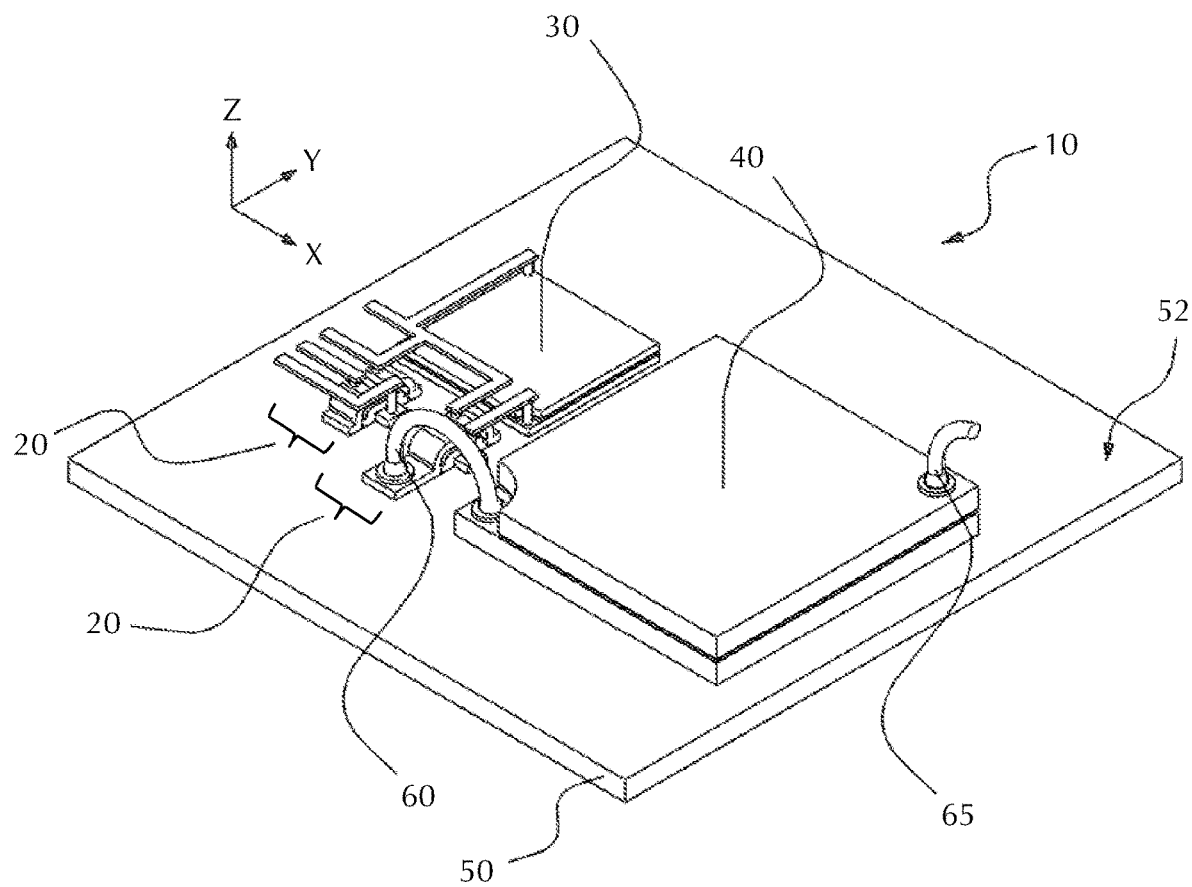
FIG. 5 schematically illustrates an isometric view of a prior art subpixel apparatus with control devices placed alongside the LED.

FIG. 5 shows an example of a prior art conventional subpixel apparatus 10. The control devices, including the thin film transistors 20 and the capacitor 30, are located alongside substantially planar LED 40. Thin film transistors 20, capacitor 30, and LED 40 are on or above surface 52 of substrate 50 in this example. Thin film transistors typically have a source, drain, and channel made from a deposited thin film or films that is or are amorphous or polycrystalline. Single crystal transistors typically have a source, drain, and channel made from a single crystal. The carrier mobility in amorphous or polycrystalline material is smaller than in a single crystal of the same material. A first wire bond 60 electrically connects LED 20 with one of the thin film transistors 20 and a second wire bond 65 connects LED 50 to a ground wire (not shown). The area of subpixel apparatus 10 is the area occupied by thin film transistors 20, capacitor 30, LED 40, and the areas between these elements. This two dimensional arrangement can occupy a large area. Thin film transistors 20 are horizontal thin film transistors, and capacitor 30 is a planar capacitor. In horizontal thin film transistors 20, the charge carriers travel in the channel parallel to substantially planar LED 40 and surface 52 of substrate 50. Planar capacitors are substantially planar and lie parallel to the plane of the substantially planar LED in a subpixel apparatus.

Embodiments of the present invention will employ stacking of the substantially planar LED over the control devices in a stacked-device configuration. Further, the orientation of the control devices will be such that the area occupied by the control devices is reduced compared to conventional control devices. The longest dimension of some or all of the control devices will be vertical, relative to the substantially planar LED, enabling the footprint of the control devices to be small. Some embodiments of the present invention will include vertical thin film transistors to minimize the area. In vertical thin film transistors, charge carriers travel in the channel orthogonal to the substantially planar LED. For thin film transistors with similar electrical properties, horizontal thin film transistors generally occupy a much larger area, or footprint, than vertical thin film transistors. If the area, or footprint, of the substantially planar LED is small enough, a horizontal thin film transistor may not fit entirely underneath the substantially planar LED, which, in turn, makes the area of the subpixel apparatus larger. Another benefit to fitting the control devices underneath the substantially planar LED is the reduction in resistance losses that comes with shorter interconnections between the control devices.

In some embodiments of the present invention, a stacked capacitor will be utilized. In a stacked capacitor, the largest dimension of the capacitor is substantially orthogonal to the substantially planar LED. Similar to thin film transistors, employing a stacked capacitor minimizes the area occupied by the capacitor.

In this application, some embodiments of a subpixel apparatus are described. In a first embodiment, a subpixel apparatus comprising vertical transistors underlying a substantially planar LED will be described. In a second embodiment, a subpixel apparatus comprising a stacked capacitor underlying a substantially planar LED is described. In a third embodiment, a subpixel apparatus comprising a stacked capacitor underlying a substantially planar LED, and two vertical thin film transistors, at least one of which underlies the stacked capacitor is described. In a fourth embodiment, a subpixel apparatus comprising two vertical thin film transistors underlying a substantially planar LED, and a stacked capacitor at least underlying one of two vertical thin film transistors is described. Other embodiments further comprising reflector layers and/or wavelength converting layers are described. Examples of methods to fabricate these embodiments are described.

Figure 6:
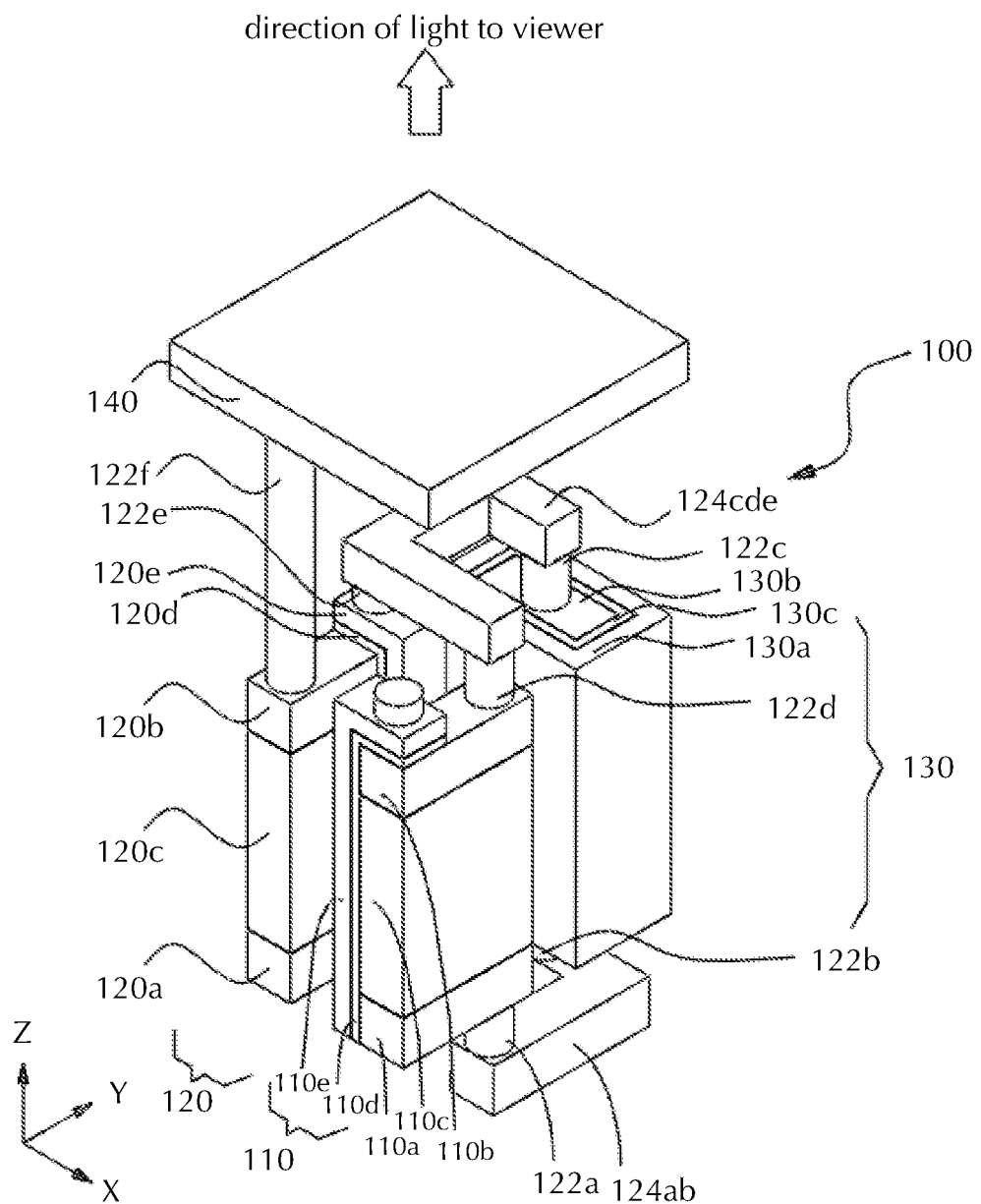
FIG. 6 schematically illustrates an isometric view of one embodiment of a subpixel apparatus with two vertical thin film transistors and a stacked capacitor underlying an LED.

Turning to FIG. 6, an embodiment of the present invention is shown in isometric view. The subpixel apparatus 100 comprises a first transistor 110, a second transistor 120, a capacitor 130, and an LED 140. LED 140 is substantially planar, and its area overlies first transistor 110, second transistor 120, and capacitor 130. Both transistors 110 and 120 shown in FIG. 6 are vertical thin film transistors, in which the charge carriers in the channel travel in a direction that is substantially orthogonal to the plane of LED 140, parallel to the indicated z axis in the figure. First transistor 110 comprises a first transistor lower source drain 110a, a first transistor upper source drain 110b which overlies first transistor lower source drain 110a, a first transistor channel 110c which is disposed between first transistor lower source drain 110a and first transistor upper source drain 110b, a first transistor gate dielectric 110d, and a first transistor gate conductor 110e. Second transistor 120 comprises a second transistor lower source drain 120a, a second transistor upper source drain 120b which overlies second transistor lower source drain 120a, a second transistor channel 120c which is disposed between second transistor lower source drain 120a and second transistor upper source drain 120b, a second transistor gate dielectric 120d, and a second transistor gate conductor 120e. Capacitor 130 is a stacked capacitor. In other embodiments (not shown), capacitor 130 may be a planar capacitor. Capacitor 130 comprises a first capacitor electrode 130a, a second capacitor electrode layer 130b, and a capacitor dielectric layer 130c disposed between capacitor electrodes 130a and 130b. Capacitor dielectric layer 130c is directly on capacitor electrode layer 130a, and capacitor electrode layer 130b is directly on capacitor dielectric layer 130c. The longest dimension of capacitor 130 is dimension L3. Dimension L3 is orthogonal to substantially planar LED 140, and is parallel to the z axis. Some, but not all, other elements of the subpixel apparatus, for example vertical interconnects 122 and horizontal interconnects 124 between elements, are shown. The volumes between each of the control devices 110, 120, and 130, and between each of the control devices 110, 120, 130, and LED 140 which are not occupied by interconnects 122 or 124 in subpixel apparatus 100 are filled with dielectric material (not shown), for example, silicon oxide. LED 140 may have an ohmic contact and interconnect (not shown) that allows current to flow from LED 140 to a ground interconnect (not shown). Capacitor 130 is in operative communication with first transistor 110 and second transistor 120 through interconnects 122*a-e*, 124*ab*, and 124*ced*. LED 140 is in operative communication with second transistor 120 through interconnect 122*f*.

Figure 7:
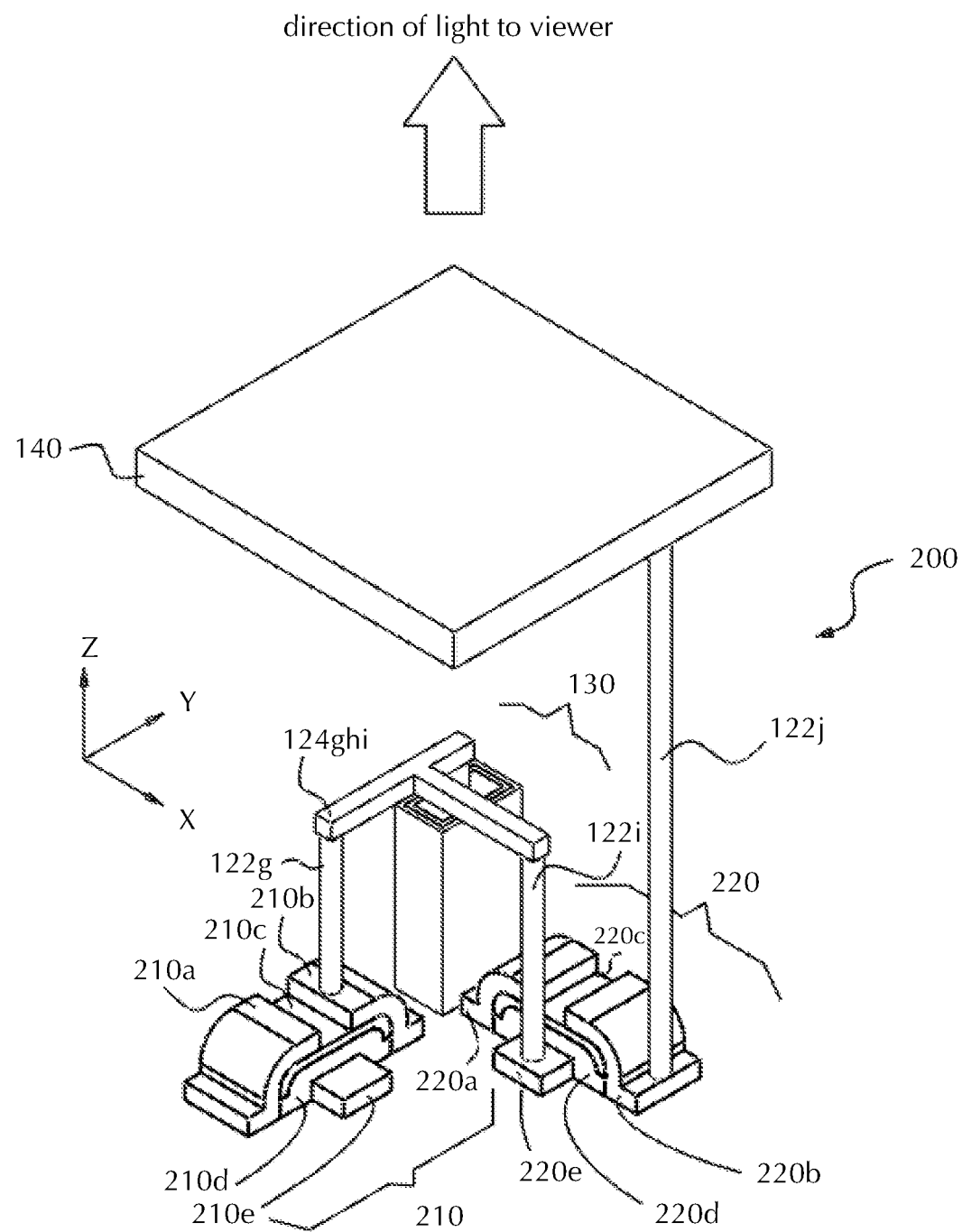
FIG. 7 schematically illustrates an isometric view of one embodiment of a subpixel apparatus with two horizontal thin film transistors and a stacked capacitor underlying an LED.

Turning to FIG. 7, another embodiment of the invention is shown in isometric view. Subpixel apparatus 200 comprises a first transistor 210, a second transistor 220, a capacitor 130, and an LED 140, wherein LED 140 is substantially planar and wherein LED 140 overlies first transistor 210, second transistor 220, and capacitor 130. Transistor 210 and 220 are horizontal thin film transistors. First transistor 210 comprises a first transistor source 210*a*, a first transistor drain 210*b*, a first transistor channel 210*c*, a first transistor gate dielectric 210*d*, and a first transistor gate conductor 210*e*. Second transistor 220 comprises a second transistor source 220*a*, a second transistor drain 220*b*, a second transistor channel 220*c*, a second transistor gate dielectric 220*d*, and a second transistor gate conductor 220*e*. The charge carriers in first transistor channel 210*c* and second transistor channel 220*c* travel in a direction substantially parallel to the plane of LED 140, this direction parallel to the X-Y plane indicated. Capacitor 130 is stacked capacitor. Capacitor 130 is in operative communication with first transistor 210 and second transistor 220 through interconnects 122*g-i* and 124*ghi*. LED 140 is in operative communication with second transistor 220 through interconnect 122*j*. The volumes between each of the control devices 210, 220, and 230, and between each of the control devices 210, 220, and 230 and the LED 140 not occupied by interconnects 122 and 124 are filled with a dielectric material (not shown), for example, silicon oxide. LED 140 may have an ohmic contact and interconnect (not shown) that drains current to a ground interconnect (not shown).

Figure 8A:
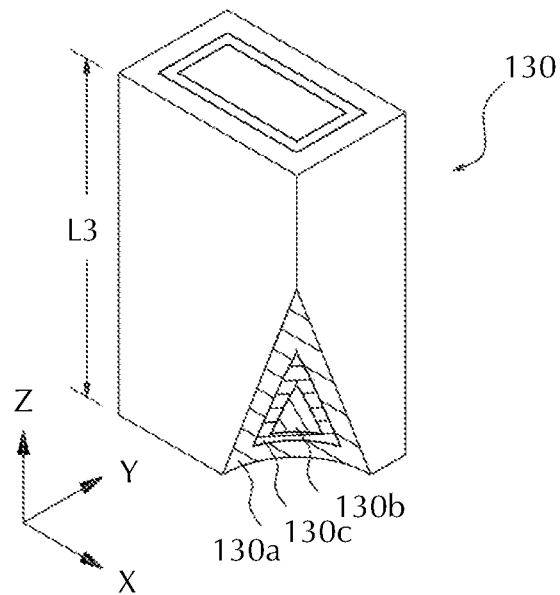
FIG. 8A schematically illustrates an isometric view of an example of a stacked capacitor with a rectangular X-Y cross section.
Figure 8B:
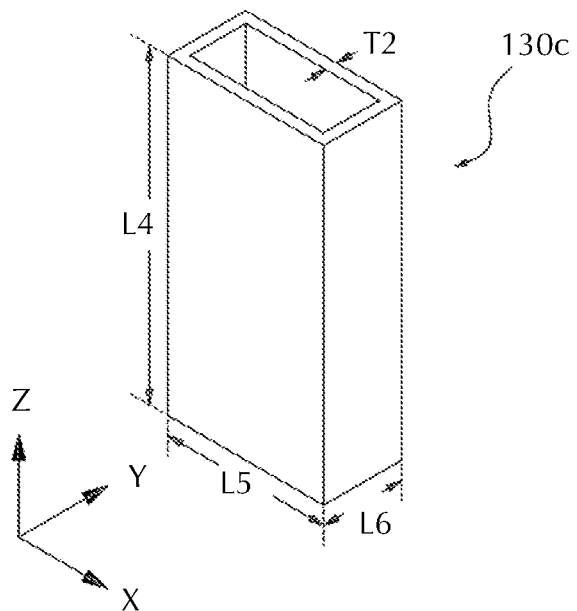
FIG. 8B schematically illustrates the capacitor dielectric layer of the stacked capacitor from FIG. 8A.

A more detailed illustration of capacitor 130 is shown in FIG. 8A, with a cutout for clarity. Capacitor 130 comprises a capacitor dielectric layer 130*c* that has a shape analogous to a box without a lid. The cross sectional X-Y plane shape of capacitor 120 is rectangular. Turning to FIG. 8B, capacitor dielectric layer 130*c* of capacitor 130 is shown by itself, without the capacitor electrodes 130*a* and 130*b*. Capacitor dielectric layer 130*c* has a thickness T2. The dimension T2, which is the thickness of capacitor dielectric layer 130*c*, is smaller than dimensions L4, L5, and L6. The longest dimension of capacitor 130 is dimension L3. The dimension T2 may be from 2 nm to 100 nm while dimensions L4, L5, and L6 may be from 0.1 micron to 100 microns. In one example, the dimension T2 may be 10 nm while dimensions L4, L5, and L6 may be, for example, 2.0 micron, 0.5 micron, and 0.2 microns, respectively.

Figure 9A:
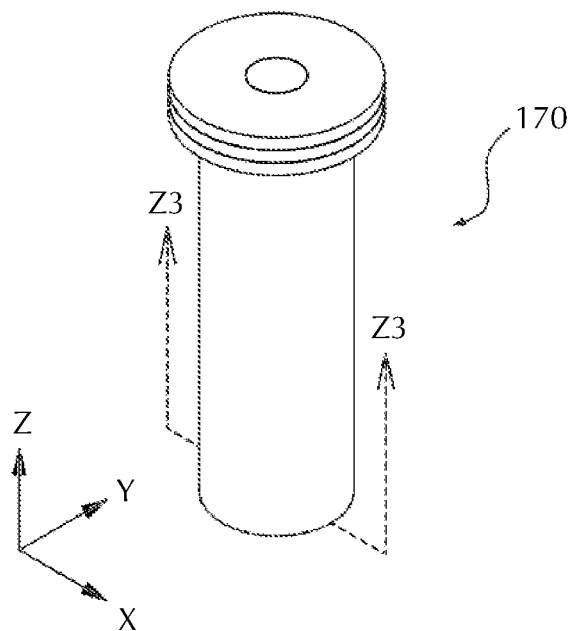
FIG. 9A schematically illustrates an isometric view of an example of a stacked capacitor with a circular X-Y cross section.
Figure 9B:
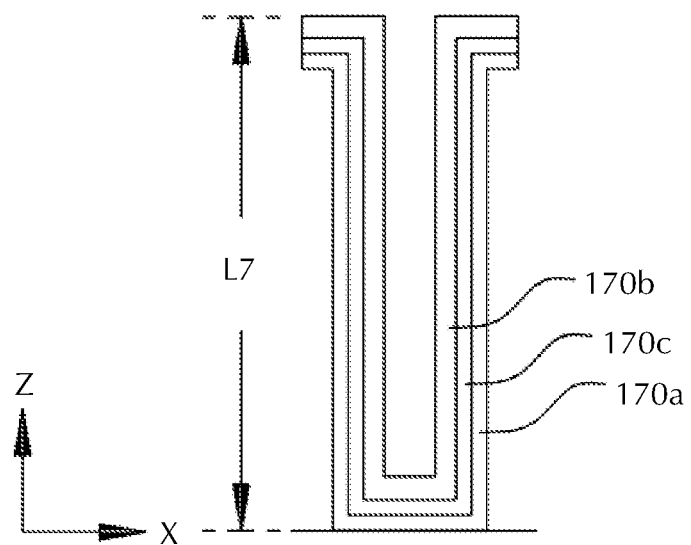
FIG. 9B illustrates a cross sectional Z3-Z3 view of the stacked capacitor from FIG. 9A.

Turning to FIG. 9A, another embodiment of a stacked capacitor is shown in isometric view. The X-Y cross section of capacitor 170 is circular. FIG. 9B illustrates a cross sectional view Z3-Z3 of capacitor 170, with a first capacitor electrode layer 170*a*, a second capacitor electrode layer 170*b*, and a capacitor dielectric layer 170*c*. The longest dimension of capacitor 170 is the dimension L7, which is parallel to the Z axis indicated in the figure. The circular X-Y cross section of capacitor 170 (FIG. 9A) may be advantageous compared with the rectangular X-Y cross section of capacitor 130 (FIG. 8A) due to ease of patterning and reduced capacitor leakage.

Figure 10:
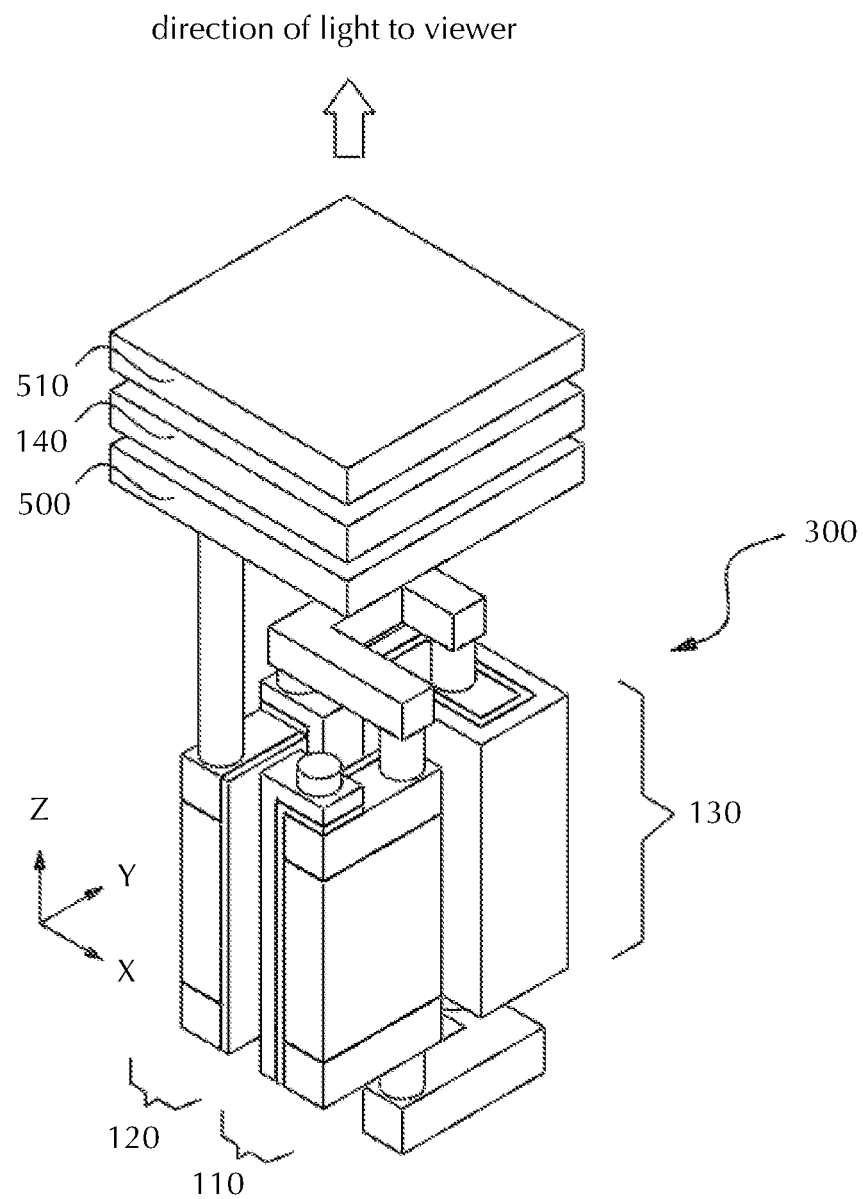
FIG. 10 schematically illustrates an isometric view of a subpixel apparatus with a reflective layer underlying the LED and a wavelength-converting layer overlying the LED.

Turning to FIG. 10, another embodiment of the present invention is shown in isometric view. Subpixel apparatus 300 comprises LED 140, which overlies first transistor 110, second transistor 120, and capacitor 130. Subpixel apparatus 300 further comprises a reflective layer 500 underlying LED 140. Reflective layer 500 reflects light emitted by LED 140 in the Z direction, directing more light towards the viewer of the subpixel apparatus, as indicated in the figure, than if there was no reflective layer. Subpixel apparatus 300 further comprises a wavelength-converting layer 510 overlying LED 140. Wavelength-converting layer 510 is excited by light emitted by LED 140, and emits light of a different dominant wavelength compared with light emitted by LED 140. By employing wavelength-converting layers, two or more subpixel apparatus of the present invention with LEDs that emit the same dominant wavelength of light can emit two or more beams of light, each beam of light with different a dominant wavelength. Three subpixel apparatus may each have LEDs that emit blue light. If two of the three subpixel apparatus have different wavelength converting layers that absorb blue light and emit green and red light, respectively, while the third subpixel apparatus does not have a wavelength-converting layer, then the three subpixel apparatus may emit green, red, and blue light. By combining red, green, and/or blue light in varying intensities, almost any color can be emitted by this group of three subpixel apparatus. In other embodiments, there may a reflective layer but no wavelength-converting layer, or there may be a wavelength-converting layer but no reflective layer in the subpixel apparatus.

Figure 11:
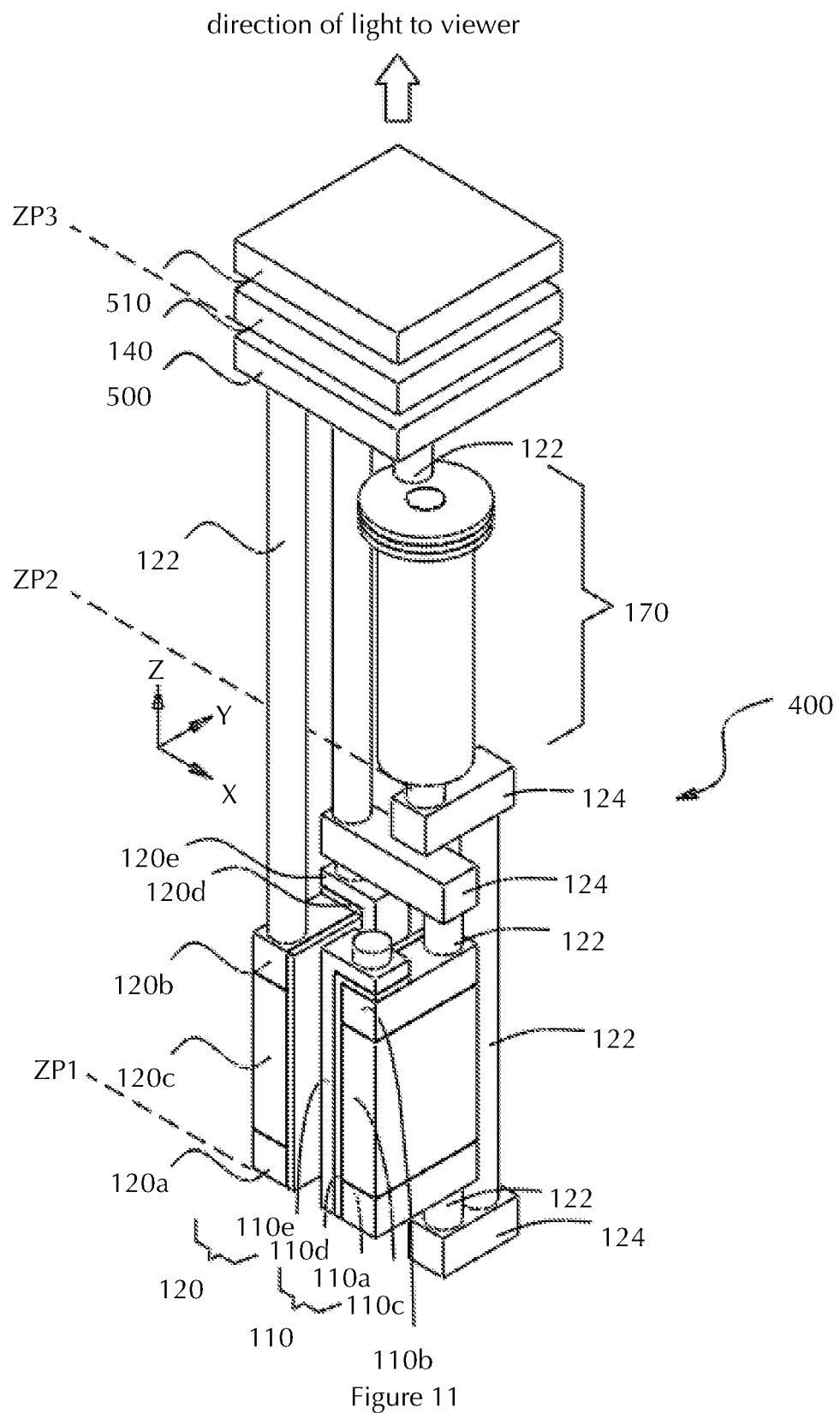
FIG. 11 schematically illustrates an isometric view of a subpixel apparatus with wavelength-converting layer, an LED, and a reflective layer, with the LED overlying a stacked capacitor and two vertical thin film transistors. The stacked capacitor overlies one or both vertical thin film transistors.

Turning to FIG. 11, another embodiment of the present invention is shown in isometric view. Subpixel apparatus 400 comprises a first transistor 110, a second transistor 120, a capacitor 170, and a substantially planar LED 140. LED 140 overlies first transistor 110, second transistor 120, and capacitor 170. Capacitor 170 is a stacked capacitor overlying first transistor 110 and/or second transistor 120. Capacitor 170 is in operative communication with first transistor 110 and second transistor 120. LED 140 is in operative communication with second transistor 120. First transistor 110 and second transistor 120 are vertical thin film transistors. First transistor 110 comprises a first transistor lower source drain 110*a*, a first transistor upper source drain 110*b* overlying first transistor lower source drain 110*a*, a first transistor channel 110*c* disposed between first transistor lower source 110*a* and first transistor upper source drain 110*b*, a first transistor gate dielectric 110*d*, and a first transistor gate conductor 110*e*. Second transistor 120 comprises a second transistor lower source drain 120*a*, a second transistor upper source drain 120*b* overlying second transistor lower source drain 120*a*, a second transistor channel 120*c* disposed between second transistor lower source 120*a* and second transistor upper source drain 120*b*, a second transistor gate dielectric 120*d*, and a second transistor gate conductor 120*e*. As shown in FIG. 9B, capacitor 170 comprises a first capacitor electrode 170*a*, a second capacitor electrode 170*b*, and a capacitor dielectric 170*c* disposed between first capacitor electrode 170*a* and second capacitor electrode 170*b*. Returning to FIG. 11, a wavelength-converting layer 510 overlies LED 140, and a reflector layer 500 underlies LED 140. In this embodiment, the transistors 110 and 120 are disposed on a first X-Y plane ZP1, the capacitor 170 is disposed on a second X-Y plane ZP2, and the LED 140 is disposed on a third X-Y plane ZP3. By stacking the capacitor 170 above the two transistors 110 and 120, the area occupied by the control devices is further reduced compared to other embodiments, enabling even smaller LED. A dielectric material (not shown) fills in the volumes between the elements of subpixel apparatus 300.

Figure 12:
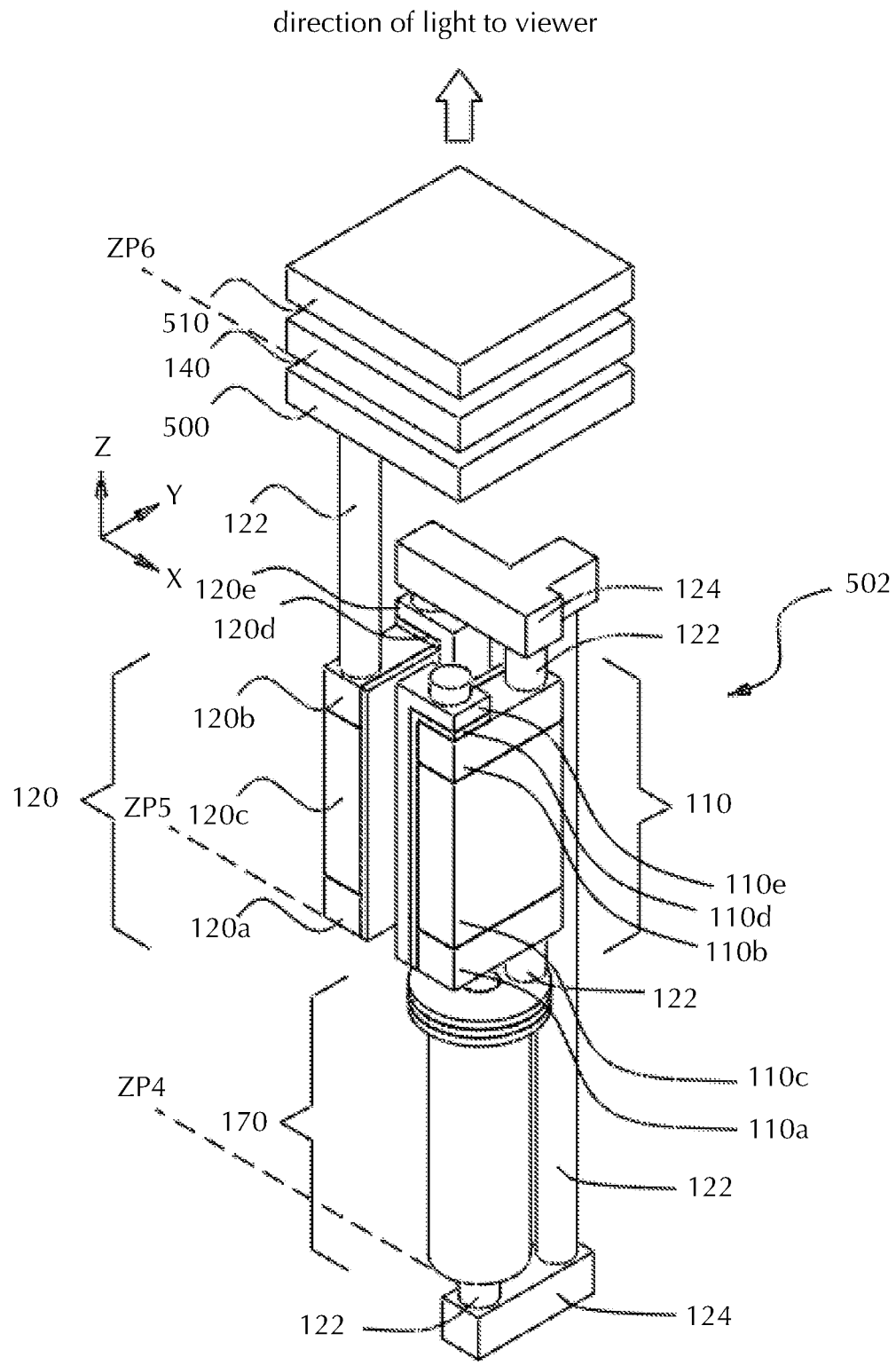
FIG. 12 schematically illustrates an isometric view of a subpixel apparatus with wavelength-converting layer, an LED, and a reflective layer, with the LED overlying two vertical thin film transistors and a stack capacitor. A stacked capacitor underlies one or both of the vertical thin film transistors.

Turning to FIG. 12, another embodiment of the present invention is shown in isometric view. Subpixel apparatus 500 502 comprises a first transistor 110, a second transistor 120, a capacitor 170, and an LED 140. LED 140 is substantially planar, and overlies first transistor 110, second transistor 120, and capacitor 170. Capacitor 170 is a stacked capacitor, and underlies the first transistor and/or second transistor. First transistor 110 and second transistor 120 are vertical thin film transistors. First transistor 110 comprises a first transistor lower source drain 110a, a first transistor upper source drain 110b overlying first transistor lower source drain 110a, a first transistor channel 110c disposed between first transistor lower source 110a and first transistor upper source drain 110b, a first transistor gate dielectric 110d, and a first transistor gate conductor 110e. Second transistor 120 comprises a second transistor lower source drain 120a, a second transistor upper source drain 120b overlying second transistor lower source drain 120a, a second transistor channel 120c disposed between second transistor lower source 120a and second transistor upper source drain 120b, a second transistor gate dielectric 120d, and a second transistor gate conductor 120e. As shown in FIG. 9B, capacitor 170 comprises a first capacitor electrode 170a, a second capacitor electrode 170b, and a capacitor dielectric 170c disposed between first capacitor electrode 170a and second capacitor electrode 170b. Returning to FIG. 12, capacitor 170 is in operative communication with first transistor 110 and second transistor 120 through interconnects 122 and 124. LED 140 is in operative communication with second transistor 120 through interconnect 122b. A wavelength-converting layer 510 overlies LED 140, and a reflector layer 500 underlies LED 140. In this embodiment, capacitor 170 is on a first X-Y plane ZP4, thin film transistors 110 and 120 are on a second X-Y plane ZP5, and LED 140 is on a third X-Y plane ZP6. A dielectric material (not shown) fills in the volumes between the elements of subpixel apparatus 400.

Some examples of methods to fabricate embodiments according to the present invention will now be discussed. When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, and/or after all the defined steps (except where context excludes that possibility). The fabrication processes described herein do not form a complete process flow, with the remainder of the process flow known to those of ordinary skill in the art. Only the methods and structures necessary to understand embodiments of the present invention are described herein.

Figure 13A:
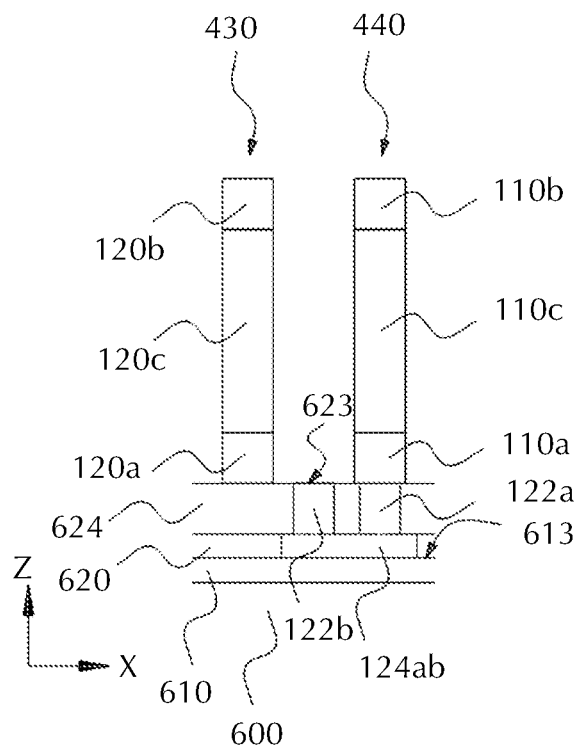
Figure 13B:
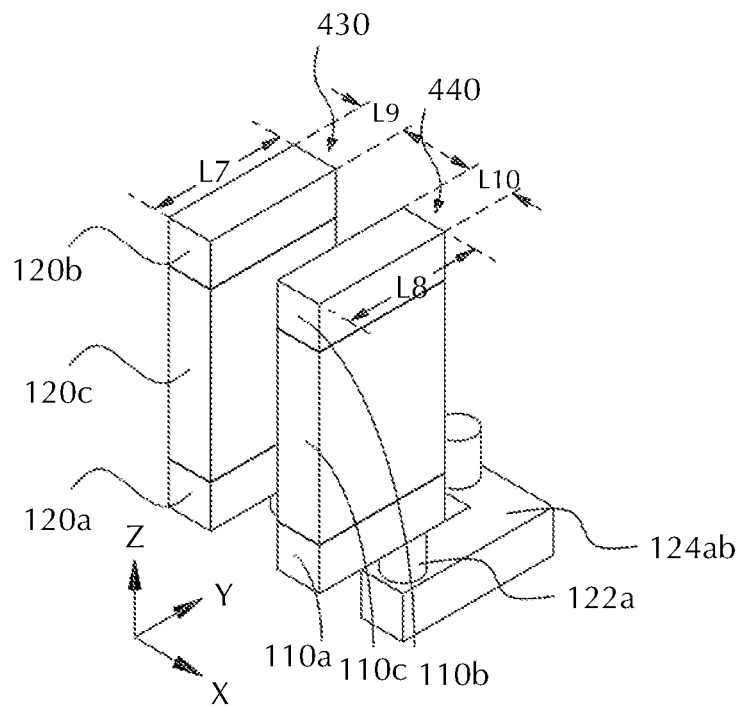

A method to fabricate subpixel apparatus 100 shown in FIG. 6 is now discussed. Turning to FIGS. 13A and 13B, the sources, channels, and drains of first and second vertical transistors are formed on control device substrate 600 with a first dielectric layer 610. First dielectric layer 610 may be any suitable material, including but not limited to silicon oxide, silicon nitride, silicon carbide, silicon oxide carbide, or aluminum oxide. Control device substrate 600 may be a single crystal material such as silicon, sapphire, silicon carbide, or an amorphous material, such as silicon oxide. A first surface 613 of first dielectric layer 610 will be smooth, to enable lithography of subsequent features of dimensions less than 5 microns. For example, the roughness of first surface 613 may be 0.1 micron root mean square or less. Control device substrate 600 and first dielectric layer 610 will not be shown in FIGS. 13B-13K for clarity, although they are present. Interconnects 122 are present in or on first dielectric layer 610. Interconnects may comprise vertical interconnects 122, or vias, which are vertically-oriented wires, and/or interconnects 124, which are horizontally-oriented wires. Interconnects 122 and 124 may comprise any suitable conductive material, including but not limited to aluminum, titanium, titanium nitride, tungsten, copper, tantalum, tantalum nitride, molybdenum, or chrome. Either vertical interconnects 122 or horizontal interconnects 124 may be formed by a subtractive process, in which conductive material is deposited on a dielectric layer, patterned, etched, and the patterning layer is removed. Either vertical interconnects 122 or horizontal interconnects 124 may be formed by a damascene process, in which a dielectric layer is patterned, etched, and the patterning layer is removed, resulting in cavities in the dielectric layer. The cavities in the dielectric layer are filled with conductive material by any suitable process, such as chemical vapor deposition (CVD), physical vapor deposition (PVD) which includes but is not limited to sputtering, evaporation, and spin on techniques, or electrodeposition. After the cavities are filled with conductive material, conductive material is then removed from everywhere but the cavities by chemo-mechanical polishing (CMP) or etchback process, leaving conductive material in the cavities. In FIG. 13A, horizontal interconnect 124ab is formed on first dielectric layer 610 by a subtractive process. A second dielectric layer 620 is deposited on interconnect 124ab on first surface 613. Second dielectric layer 620 may then have its surface 623 planarized by any suitable process, such as etchback or CMP. Second dielectric layer 620 may be any suitable material, including but not limited to silicon oxide, silicon nitride, silicon carbide, silicon oxide carbide, or aluminum oxide. Second dielectric layer 620 may be deposited by any suitable technique, such as CVD, PVD, or electrodeposition. Vertical interconnects 122a and 122b are then formed in second dielectric layer 620 by a damascene process.

Next, the lower source drain layer of the eventual first and second transistors is deposited, followed by the channel layer, and finally the upper source drain layer, forming a layer stack with three layers. The lower source drain layer, channel layer, and upper source drain layer can be deposited by any suitable method, such as CVD, PVD, or electrodeposition. The lower source drain layer may be any suitable thickness, for example from about 0.01 microns to 5 microns. The lower source drain layer may comprise any suitable material, including but not limited to silicon, germanium, silicon germanium, molybdenum, aluminum, aluminum zinc oxide, or indium tin oxide. The channel layer is deposited directly on the lower source drain layer and may be any suitable thickness, for example from about 0.01 microns to 10 microns. The channel layer may comprise any suitable material, including but not limited to silicon, germanium, silicon germanium, or indium gallium zinc oxide. The thickness of each layer may be determined in part by the electrical characteristics of the eventual thin film transistor. The upper source drain layer is deposited directly on the channel layer, and may be of the same thicknesses and materials as described earlier for the lower source drain layer. In one example, the lower and upper source drain layers comprise heavily doped n-type silicon and the channel layer is lightly doped p-type silicon. In another example, the lower source drain layer and the upper source drain layers are molybdenum and the channel layer is indium gallium zinc oxide. The layer stack is patterned (not shown) and etched to form two patterned layer stacks 430 and 440, as shown in FIGS. 13A and 13B. The two patterned layer stacks 430 and 440 may have any suitable dimensions L7, L8, L9, and L10. Dimensions L7 and L8 may be same or different from one another. Dimensions L9 and L10 may be the same or different from one another. The dimensions L9 and L10 may be from about 0.05 microns to 10 microns, and the dimensions L7 and L8 may from about 0.1 microns to 10 microns. The patterning layer (not shown) is removed. The patterned layer stack 440 has a first transistor lower source drain 110a, a first transistor channel 110c, and a first transistor upper source drain 110b overlying first transistor lower source drain 110a; and the patterned layer stack 430 has a second transistor lower source drain 120a, a second transistor channel 120c, and a second transistor upper source drain 120b overlying second transistor lower source drain 120a. First transistor lower source drain 110a is in operative communication with interconnect 122a. In the embodiment described above, the layer stacks 430 and 440 are formed simultaneously using the same materials and thicknesses. In other embodiments, the layer stacks 430 and 440 may not be formed simultaneously, and layer stacks 430 and 440 may comprise different materials and thicknesses.

Figure 13C:
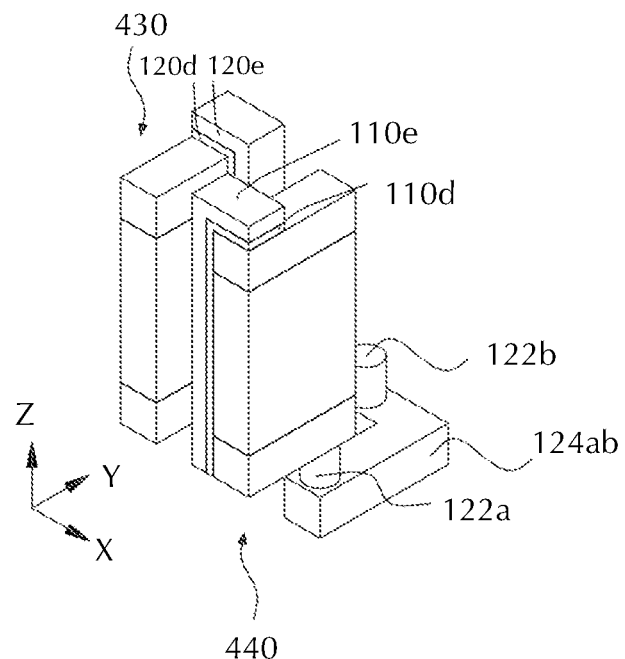

Turning to FIG. 13C, the gate dielectric and gate conductor layers are now formed on patterned layer stacks 430 and 440. A gate dielectric layer is deposited on second dielectric layer 620, and on the sidewalls of and on the top surfaces of patterned layer stacks 430 and 440. The gate dielectric layer may be deposited by any suitable technique, such as PVD or CVD, or may be grown by thermal techniques. The gate dielectric layer may be any suitable thickness, for example from about 1 nm to 200 nm. The gate dielectric layer may be any suitable material, including but not limited to silicon oxide, silicon nitride, silicon oxide nitride, aluminum oxide, hafnium oxide, hafnium silicate oxide, zirconium oxide, titanium oxide, tantalum oxide, or combinations thereof. A gate conductor layer is deposited directly on the gate dielectric layer. The gate conductor layer may be deposited by any suitable technique, such as PVD or CVD. The gate conductor layer may be any suitable thickness, for example from about 10 nm to 400 nm, and may be any suitable material, including but not limited to silicon, silicon germanium, germanium, titanium nitride, tungsten, aluminum, tantalum nitride, molybdenum, chrome, titanium, indium tin oxide, aluminum zinc oxide, or alloys or combinations thereof. The gate dielectric and gate conductor layers are then patterned (not shown) and etched to form first and second transistor gate dielectrics 110d and 120d, respectively, and first and second transistor gate conductors 110e and 120e, respectively, shown in FIG. 13C. The patterning layer (not shown) is removed. Formation of first transistor 110 and second transistor 120 is now substantially complete. In other embodiments, first and second gate dielectrics 110d and 120d may be different thicknesses and different materials.

Figure 13D:
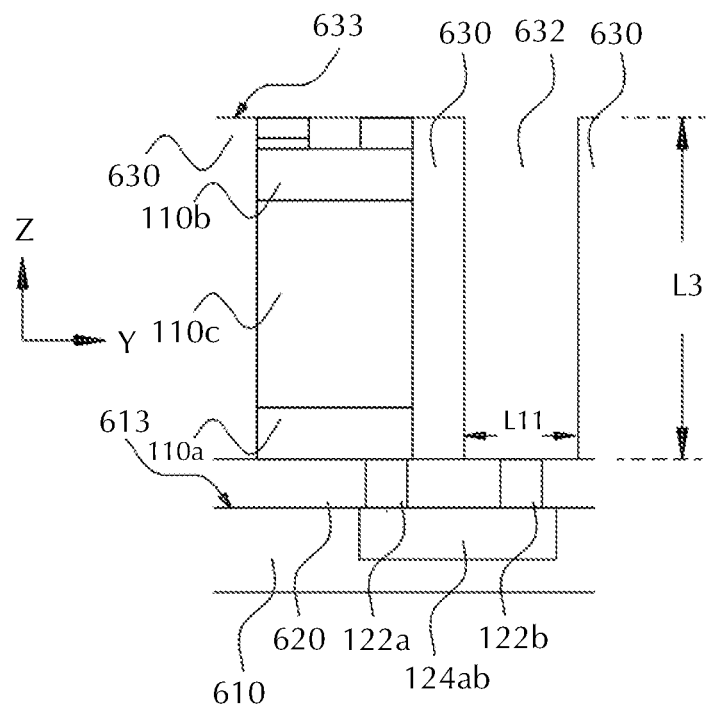

Turning to FIG. 13D, a third dielectric layer 630 is deposited on top of and surrounding thin film transistors 110 and 120. Third dielectric layer 630 may be any suitable material, including but not limited to silicon oxide, silicon nitride, silicon carbide, silicon oxide carbide, or aluminum oxide. Third dielectric layer 630 may be deposited by any suitable technique, such as CVD, PVD, or spin-on techniques. Third dielectric layer 630 is planarized by any suitable technique, such as CMP or etchback such as to render surface 633 substantially planar and parallel to first surface 613 of dielectric layer 610.

Figure 13E:
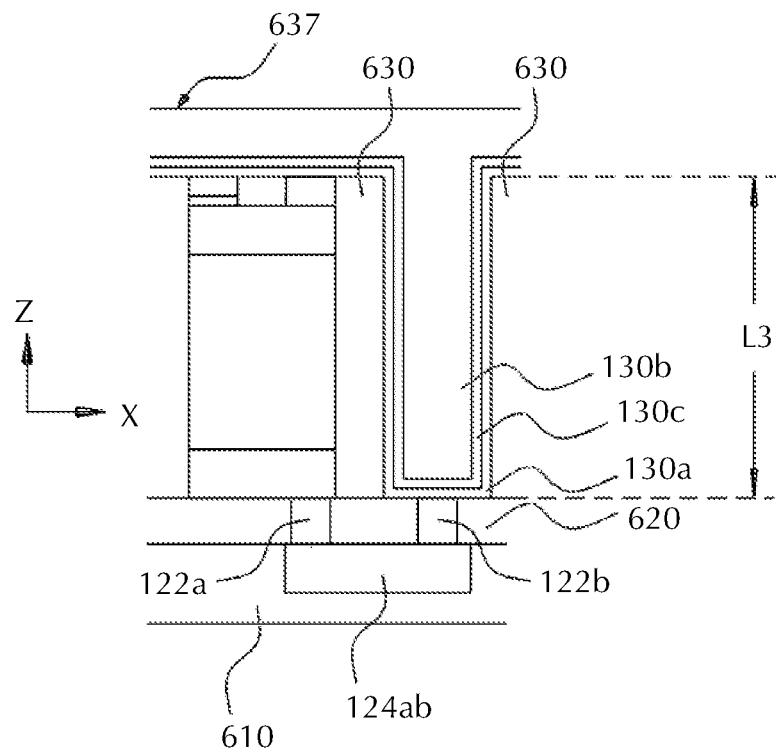

The capacitor is next fabricated. Third dielectric layer 630 is patterned (not shown), and a portion of third dielectric layer 630 is removed by etching, leaving a cavity 632, as shown in cross sectional view in FIG. 13D. The cavity may have any suitable size and shape. The dimension L3 may be from 0.2 microns to 100 microns, and the dimension L11 may be from 0.02 microns to 10 microns. Turning to FIG. 13E, a first capacitor electrode layer 130a, a capacitor dielectric layer 130c, and a second capacitor electrode layer 130b are deposited sequentially in cavity 632 (shown in FIG. 13D) and on top of third dielectric layer 630. Capacitor electrode layers 130a and 130b and capacitor dielectric layer 130c may be deposited by any suitable technique, such as CVD or PVD. Capacitor electrode layers 130a and 130b may be any suitable material, including but not limited to doped silicon, titanium, titanium nitride, tantalum, tantalum nitride, tungsten, cobalt, aluminum, ruthenium, or combinations or alloys thereof. Capacitor electrode 130a may be a different material than capacitor electrode 130b. Capacitor electrode layers 130a and 130b may be any suitable thickness, for example, from about 0.005 microns to 0.3 microns. Capacitor dielectric layer 130c may be any suitable material, including but not limited to silicon oxide, silicon nitride, silicon oxide nitride, hafnium oxide, aluminum oxide, titanium oxide, or combinations or alloys thereof. Capacitor dielectric layer 130c may be any suitable thickness, for example from about 0.001 microns to 0.2 microns. In one example, first and second capacitor electrodes are titanium nitride and the capacitor dielectric is a combination of aluminum oxide and hafnium oxide.

Figure 13F:
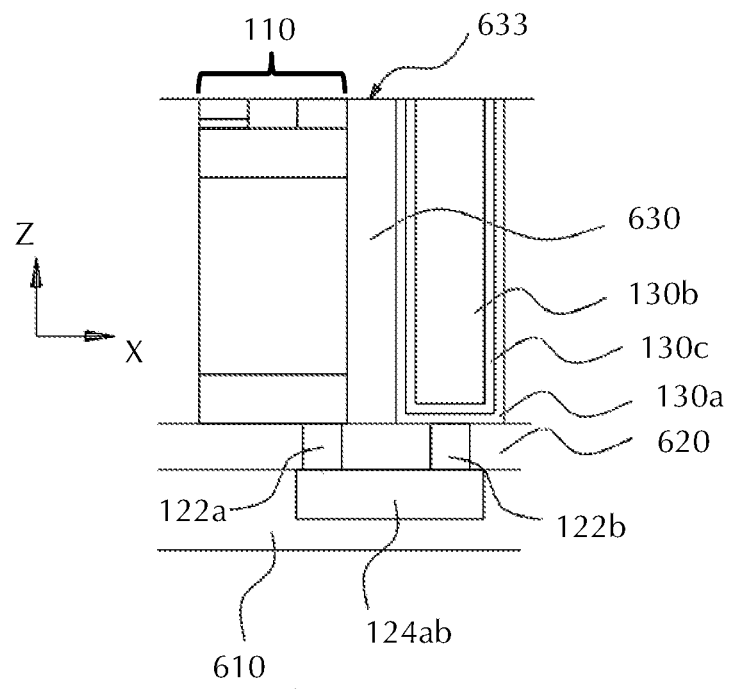
Figure 13G:
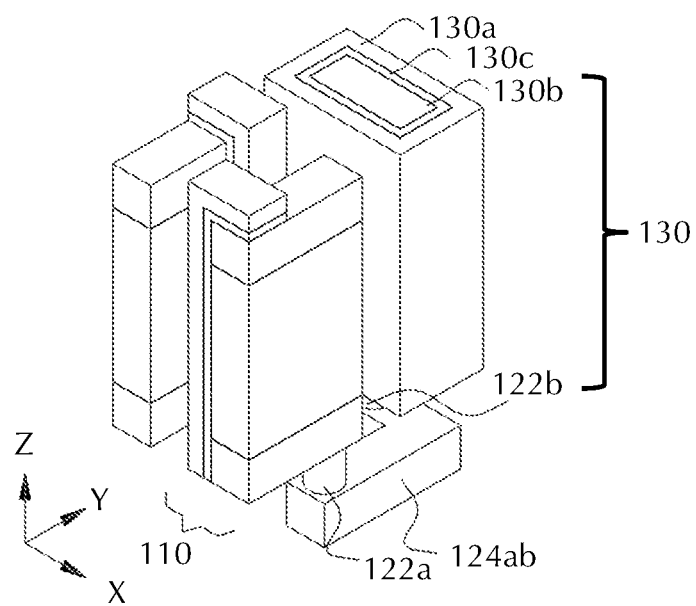

Turning to FIG. 13F, after deposition of capacitor layers 130a, 130b, and 130c, any suitable technique, such as CMP or etchback, may be used to remove portions of capacitor layers 130a, 130b, and 130c from top surface 633 of third dielectric layer 630, forming first capacitor electrode 130a, capacitor dielectric 130c, and second capacitor electrode 130b. Turning to FIG. 13G, capacitor 130 fabrication is now substantially complete. Capacitor 130 is in operative communication with first transistor 110 through interconnects 122a, 122b, and 124ab.

Figure 13H:
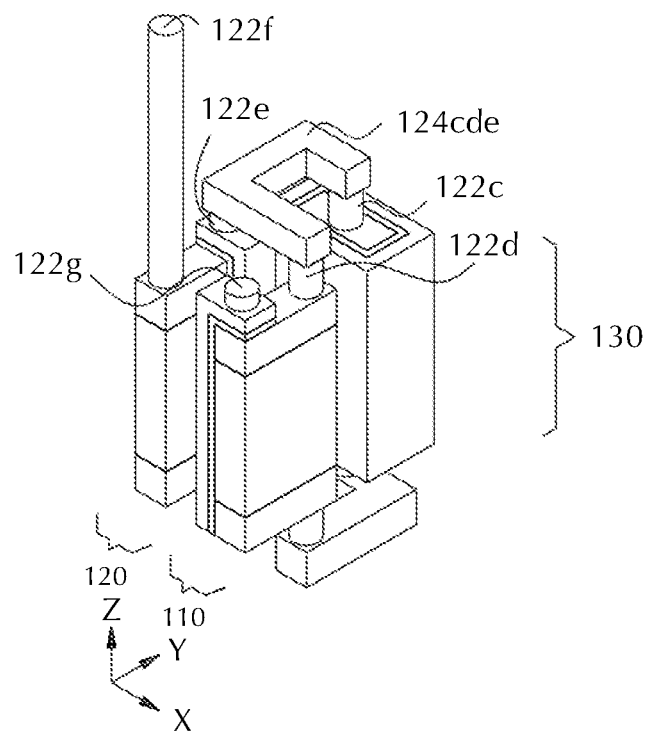

Turning to FIG. 13H, interconnects 122c-g, and 124cde above the control devices are next formed using similar interconnect fabrication techniques described earlier. A fourth dielectric layer (not shown) surrounds portions of via interconnects 122c-g and interconnect 124cde, and is above the control devices. The fourth dielectric layer may be any suitable material, including but not limited to silicon oxide, silicon nitride, silicon carbide, silicon oxide carbide, or aluminum oxide. Fourth dielectric layer may be deposited by any suitable technique, such as CVD or PVD. The top surface of fourth dielectric layer may be planarized by any suitable technique, such as CMP or etchback.

The next step in fabrication is to form an LED over the control devices. LED formation is summarized as: the individual LED is first fabricated on a different substrate from the control device substrate; the LED substrate with LED is flipped over; the LED is bonded to interconnects that are in operative communication with the control devices; and the LED substrate is removed. Turning to FIG. 13I, LED 140 with ohmic contact 710 is fabricated on LED substrate 700. LED substrate 700 may comprise single crystal sapphire, silicon, or silicon carbide, or any suitable single crystal material that is lattice matched to the semiconductor material of LED 140. LED 140 may comprise inorganic materials, including but not limited to GaP, AlGaAs, GaAsP, AlGaP, GaInP, InGaN, AlGaN, AN, InN, or InP, most preferably GaN. Ohmic contact 710 may comprise gold, nickel, titanium, or any suitable material that forms an ohmic contact to the semiconductor LED. Techniques to fabricate LEDs on substrates, including single crystal LED deposition, LED etching to define a single LED from a larger LED layer, and formation of ohmic contacts to the LED, are well known to those skilled in the art, and will not be discussed in detail.

Turning to FIG. 13J, after formation of LED 140 on LED substrate 700, the apparatus is flipped over and LED 140 is joined to interconnect 122 through ohmic contact 710 by a bonding technique. The bonded devices are shown in FIG. 13K. Any suitable bonding technique may be used, including but not limited to hybrid, thermocompression, anodic, plasma activated, eutectic, or surface activated, most preferably hybrid wafer bonding. Hybrid wafer bonding describes the joining of two surfaces, wherein at least one of the two surfaces has at least two different materials. The two surfaces are brought into contact under pressure and heat to achieve a bond. In this case, surface 643 has fourth dielectric layer 640 and interconnect 122 as exposed surface materials. Although a gap is shown between surface 643 and surface 143, surfaces 643 and 143 may be in contact due to compliance of the materials. The structures being bonded may be: wafer-to-wafer, in which two wafers each with multiple die are bonded to one another; die-to-wafer, in which a die is bonded to a wafer; or die-to-die, in which one die is bonded to another die. In the description above, a die has a smaller footprint than a wafer. Most preferably, wafer-to-wafer bonding is employed. As shown in FIG. 13K, after bonding, LED 140 is in operative communication with the control devices underneath. It is important to note that the LED is not connected to the control devices through wire bonds, which are common in the prior art (see, for example, wire bond 60 in FIG. 5). Wire bonds are interconnects that join two devices by a wire that was mechanically placed and bonded using downward pressure and ultrasonic energy and/or heat. The wires in wire bonds are typically 15 microns in diameter or larger, and have metal balls at either end that are larger than 15 microns in diameter. These very large dimensions and the considerable cost make wire bonding unsuitable for the interconnects between LED 140 and underlying control devices in the present application. Interconnect 122 in FIG. 13K may have an X-Y cross sectional area of 1 micron squared or less, although any suitable area may be used. The size of interconnects 122 and 124 is defined by photolithography, which can currently produce features of less than 50 nm, far smaller than can be produced by conventional wire bonding techniques.

As shown in cross sectional view FIG. 13L, after bonding, LED substrate 700 is removed. LED substrate 700 may be removed by a laser process. If LED substrate 700 is sapphire, a KrF Excimer laser with an energy density of 400 mJ/cm$^2$, a wavelength of 248 nm, and a pulse width of 38 ns can irradiate the sapphire surface at an elevated temperature of 60° C. and remove the sapphire substrate 700 from LED 140. LED substrate 700 may be removed by chemical etching. If LED substrate 700 is GaAs, a solution of $NH_4OH:35H_2O$ or a solution of $5H_3PO_4:3H_2O_2:3H_2O$ can be applied to remove the GaAs substrate from LED 140. If LED substrate 700 is silicon, a solution of KOH, TMAH, $HF+HNO_3$, or $HF+NH_4F$ can be applied to remove LED substrate 700. All or a portion of LED substrate 700 may be removed by grinding and polishing techniques. If a portion of LED substrate 700 is removed by grind and polish techniques, the remaining portion of LED substrate 700 may be removed by chemical etching, corrosive gas etching, or laser liftoff, as described above.

Other fabrication steps, such as ohmic contact and/or interconnect formation to LED 140 on surface 146 and application of a passivating film layer overlying LED 140 may be accomplished (not shown). An interconnect from an ohmic contact on LED surface 146 may go to a ground wire (not shown). These steps, namely connecting LED 140 to ground, and formation of a passivating layer, are well known to those skilled in the art and will not be discussed in detail.

Figure 14:
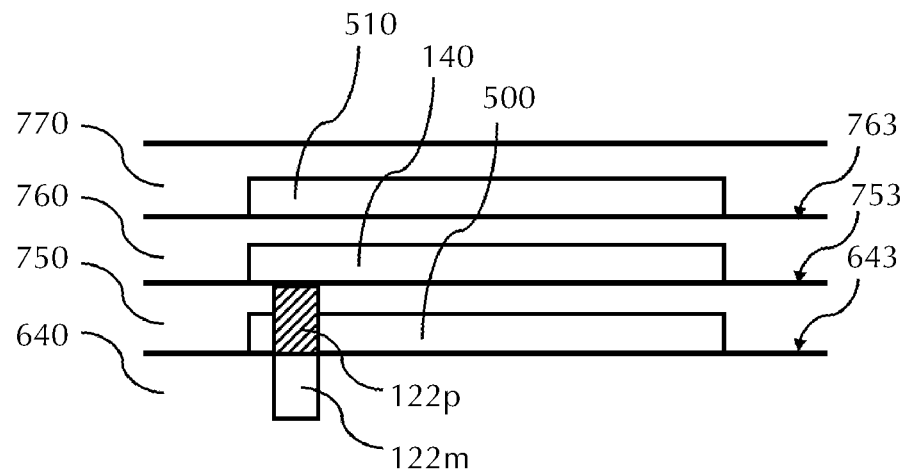
FIG. 14 is a cross sectional schematic detail of FIG. 10, showing the layers nearby the LED.

FIG. 14 is a detail of the layers near LED 140 in FIGS. 10, 11, and 12. As shown in FIG. 14, other layers, such as reflective layer 500 or wavelength-converting layer 510 may be incorporated in the subpixel apparatus. Reflective layer 500 may be any suitable material that substantially reflects light of the dominant wavelength emitted by LED 140. Substantially reflective is to mean at least 70% of the light is reflected by the layer. Suitable materials for reflective layer 500 include but are not limited to metals like aluminum, gold, or silver, alloys of aluminum, gold, or silver, a composite material such as a polymer mixed with metal oxide particles, or a distributed Bragg reflector (DBR), most preferably a DBR. A DBR includes one or more pairs of dielectric layers (not shown). Each dielectric layer in a pair has a different index of refraction. Turning to the cross sectional view in FIG. 14, reflective layer 500 may be deposited on surface 643 of fourth dielectric layer 640 by any suitable method, including but not limited to evaporation, sputtering, CVD, or atomic layer deposition (ALD), which is a type of CVD, most preferably by evaporation. The thickness of each dielectric layer in the DBR is designed to be about one quarter of the wavelength of light that is to be reflected. The wavelength of light varies with the index of refraction of each material. For example, for an active layer of an LED that emits blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 67±7 nm thick and the titanium oxide layer is 49±5 nm thick. A reflective layer 500 that is a DBR may comprise silicon oxide, silicon nitride, aluminum oxide, tantalum oxide, or titanium oxide, or any other suitable dielectric materials. Reflective layer 500 may be patterned (not shown) and etched into any suitable shape.

After reflective layer 500 is fabricated, a fifth dielectric layer 750 may be deposited on reflective layer 500 and surface 643 of fourth dielectric layer. Fifth dielectric layer 750 may be planarized after deposited such that surface 753 is substantially planar to surface 643. Interconnect 122p may be fabricated after fifth dielectric layer 750 is planarized. Interconnect 122p may be formed by patterning (not shown) and etching cavities in fifth dielectric layer 750, reflective layer 500, and fourth dielectric layer 460. The cavity exposes the top surface of interconnect 122m. The cavities formed by this etch may be filled by deposition of conductive material. Excess conductive material on surface 753 may be removed by CMP or etchback. Interconnect 122p is in operative communication with interconnect 122m.

LED 140 is then bonded to interconnect 122p as described previously and the LED substrate (not shown) is removed. Sixth dielectric layer 760 is then deposited on LED 140 and fifth dielectric layer 750. Sixth dielectric layer 760 may be planarized after deposition such that surface 763 is substantially parallel to surface 753. Wavelength-converting layer 510 is is then formed on sixth dielectric layer 760. Wavelength-converting layer 510 may comprise an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In a different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In another embodiment, silicone, epoxy, or polycarbonate may be combined with quantum dots. The quantum dots may be any suitable nano-scale semiconductor material, for example group II-VI material having a composition ZnCdMgSe, CdSe, InP, ZnS, $K_2SiF_6$:Mn, $SrLi_3Al_3N_4$:Eu, or $CsPbBr_3$. In one embodiment, the composition of the quantum dots can be optimized to emit red (500 to 550 nm) or green (610 to 730 nm) light when excited by blue light (420 to 470 nm). In one embodiment, wavelength-converting layer 510 may be screen printed into any suitable pattern over LED 140. Quantum dots are preferred over phosphor particles as quantum dots are smaller than phosphor particles, and can therefore be more easily patterned into smaller feature sizes.

In a different embodiment, wavelength-converting layer 510 may be phosphor particles or quantum dots embedded in glass, a technique known as phosphor-in-glass (PiG) or quantum dot-in-glass (QDiG). In one embodiment, glass paste combining $SiO_2$, $B_2O_3$, phosphor particles or quantum dots, adhesive, and organic solvent may be screen printed in a pattern or using a stencil. In a different embodiment, the glass paste with phosphor particles or quantum dots may be screen printed without a pattern. The volatile organic components of the glass paste may be removed by drying at 150° C. and sintering at 600° C. In a different embodiment, the PiG or QDiG layer may be deposited by a spin-on technique, in which chemicals and phosphor particles or quantum dots are suspended in organic solvents. The solution is spun as a continuous film. The film is dried and annealed, which substantially removes the organic materials, leaving a glass film with phosphor particles or quantum dots. If wavelength-converting layer 510 was deposited as a continuous film, a masking layer (not shown) can be applied, patterned, and wavelength-converting layer 510 etched. Wavelength-converting layer 510 may be etched by any suitable etchant, including but not limited to acids or corrosive gases. The masking layer (not shown) is removed. Wavelength-converting layer 510 may be realized in a small form by the technique of depositing PiG or QDiG in continuous film form, depositing a masking layer and patterning, etching the film, and then removing the masking layer.

Figures 15A, 15B:
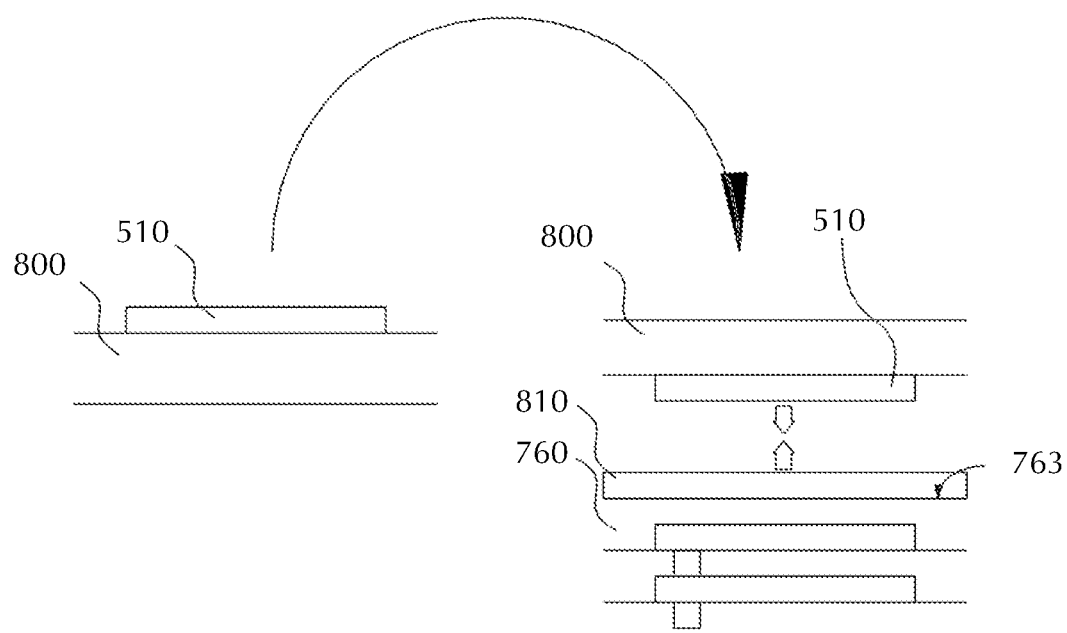
FIG. 15A schematically illustrates a cross sectional view of a MQW-containing wavelength-converting layer fabricated on a substrate.
FIG. 15B schematically illustrates a cross sectional view of bonding a MQW wavelength-converting layer to a partially completed subpixel apparatus.

In another embodiment, wavelength-converting layer 510 may comprise multiple quantum wells (MQWs). Quantum wells are two dimensional films of inorganic semiconductors, and comprise pairs of alternating films of different materials, for example, ZnCdSe/ZnSe, ZnCdSe/ZnCdMgSe, InGaN/GaN, AlGaNInP/GaNInP, or any suitable pairing. In one example as shown in FIG. 15A, wavelength-converting layer 510 comprising MQWs of GaInN/GaN are grown on a thick n-type GaN layer on a sapphire substrate 800. As shown in FIG. 15B, wavelength-converting layer 510 comprising MQWs is bonded to fifth dielectric layer 760 using a layer of an intervening high index of refraction silicone 810, and the n-type GaN and sapphire substrate 800 is then removed by substrate removal techniques described earlier. The wavelength-converting layer 510 can be patterned (not shown) and etched, either before or after bonding to the subpixel apparatus. In one example, GaInN/GaN MQW films in wavelength-converting layer 510 absorb blue light from LED 140 and emit green light. In another example, AlGaNInP/GaNInP MQW films in wavelength-converting layer 510 absorb blue light from LED 140 and emit red light.

A passivating layer 770 shown in FIG. 14 may overlie reflective layer 500, LED 140, and wavelength-converting layer 510. Passivating layer 770 may be any suitable material, for example an inorganic dielectric such as silicon oxide or an organic dielectric such as silicone.

The embodiments shown in FIGS. 11 and 12 may be fabricated using techniques similar to those described in the example fabrication description of the embodiment shown in FIG. 6. For the embodiment shown in FIG. 11, the transistors 110 and 120 are fabricated on the X-Y plane ZP1, as described previously. Capacitor 170 is fabricated on the X-Y plane ZP2 in the dielectric layer overlying transistors 110 and 120. LED 140, wavelength-converting layer 510, and reflector layer 500 are fabricated as described previously. For the embodiment shown in FIG. 12, capacitor 170 is fabricated on the X-Y plane ZP4 with a dielectric layer overlying it. Transistors 110 and 120 are fabricated on the Z-Y plane ZP5 on the dielectric layer overlying capacitor 170. Fabrication of LED 140, wavelength-converting layer 510, and reflector layer 500 are fabricated as described previously.

What is claimed is:

1. A subpixel apparatus comprising:
    a first transistor comprising:
        a) a first transistor lower source drain,
        b) a first transistor upper source drain overlying the first transistor lower source drain,
        c) a first transistor channel disposed between the first transistor lower source drain and the first transistor upper source drain,
        d) a first transistor gate dielectric, and
        e) a first transistor gate conductor;
    a second transistor comprising:
        a) a second transistor lower source drain,
        b) a second transistor upper source drain overlying the second transistor lower source drain,
        c) a second transistor channel disposed between the second transistor lower source drain and the second transistor upper source drain,
        d) a second transistor gate dielectric, and
        e) a second transistor gate conductor;
    a capacitor in operative communication with the first transistor and the second transistor; and
    a substantially planar light emitting diode overlying the first transistor, the second transistor, and the capacitor, and in operative communication with the second transistor.

2. The subpixel apparatus of claim 1 wherein the capacitor overlies the first transistor and/or the second transistor.

3. The subpixel apparatus of claim 1 wherein the wherein the capacitor underlies the first transistor and/or the second transistor.

4. The subpixel apparatus of claim 1 wherein charge carriers in the first transistor channel and the second transistor channel travel in a direction substantially orthogonal to the substantially planar light emitting diode.

5. The subpixel apparatus of claim 1 further comprising a reflective layer underlying the substantially planar light emitting diode and overlying the first transistor, the second transistor, and the capacitor.

6. The subpixel apparatus of claim 5 wherein the reflective layer comprises a Bragg reflector.

7. The subpixel apparatus of claim 1 wherein the first transistor channel or the second transistor channel is amorphous or polycrystalline, and wherein the first transistor channel or second transistor channel comprises silicon germanium, zinc oxide, zinc oxide nitride, indium zinc oxide, or indium gallium zinc oxide.

8. The subpixel apparatus of claim 1 wherein the first transistor lower source drain or first transistor upper source drain comprises silicon, germanium, silicon germanium, molybdenum, titanium, aluminum, indium tin oxide, or aluminum zinc oxide.

9. The subpixel apparatus of claim 1 wherein the capacitor has a longest dimension, and wherein the longest dimension is substantially orthogonal to the substantially planar light emitting diode.

10. The subpixel apparatus of claim 1 wherein the substantially planar light emitting diode comprises inorganic materials.

11. The subpixel apparatus of claim 1 wherein the substantially planar light emitting diode has a largest area, and wherein the largest area is less than 400 square microns.

12. The subpixel apparatus of claim 1 wherein the substantially planar light emitting diode has a largest area, and wherein the largest area is less than 100 square microns.

13. The subpixel apparatus of claim 1 further comprising a wavelength-converting layer overlying the substantially planar light emitting diode, wherein the wavelength-converting layer comprises quantum dots or quantum wells.

14. A subpixel apparatus comprising:
  a first transistor comprising:
    a) a first transistor source,
    b) a first transistor drain,
    c) a first transistor channel,
    d) a first transistor gate dielectric, and
    e) a first transistor gate conductor;
  a second transistor comprising:
    a) a second transistor source,
    b) a second transistor drain,
    c) a second transistor channel,
    d) a second transistor gate dielectric, and
    e) a second transistor gate conductor;
  a capacitor having a longest dimension, wherein the capacitor is in operative communication with the first transistor and the second transistor;
  a substantially planar light emitting diode overlying the first transistor, the second transistor, and the capacitor, and wherein the substantially planar light emitting diode is in operative communication with the second transistor; and
  wherein the longest dimension of the capacitor is substantially orthogonal to the substantially planar light emitting diode.

15. The subpixel apparatus of claim 14 wherein the capacitor overlies the first transistor and/or the second transistor.

16. The subpixel apparatus of claim 14 wherein the wherein the capacitor underlies the first transistor and/or the second transistor.

17. The subpixel apparatus of claim 14 further comprising a reflective layer underlying the light emitting diode and overlying the first transistor, the second transistor, and the capacitor.

18. The subpixel apparatus of claim 17 wherein the reflective layer comprises a Bragg reflector.

19. The subpixel apparatus of claim 14 wherein the first transistor channel or the second transistor channel is amorphous or polycrystalline, and wherein the first transistor channel or the second transistor channel comprises silicon germanium, zinc oxide, zinc oxide nitride, indium zinc oxide, or indium gallium zinc oxide.

20. The subpixel apparatus of claim 14 wherein the first transistor source comprises silicon, germanium, silicon germanium, molybdenum, titanium, aluminum, indium tin oxide, or aluminum zinc oxide.

21. The subpixel apparatus of claim 14 further comprising a wavelength-converting layer overlying the substantially planar light emitting diode, wherein the wavelength-converting layer comprises quantum dots or quantum wells.

22. The subpixel apparatus of claim 14 wherein the substantially planar light emitting diode comprises inorganic materials.

23. The subpixel apparatus of claim 14 wherein the substantially planar light emitting diode has a largest area, and wherein the largest area is than 400 square microns.

24. The subpixel apparatus of claim 14 wherein the substantially planar light emitting diode has a largest area, and wherein the largest area is less than 100 square microns.

* * * * *